United States Patent
Chen et al.

(10) Patent No.: US 11,374,544 B2
(45) Date of Patent: Jun. 28, 2022

(54) CAPACITIVE-COUPLED CHOPPER INSTRUMENTATION AMPLIFIERS AND ASSOCIATED METHODS

(71) Applicant: Maxim Integrated Products, Inc., San Jose, CA (US)

(72) Inventors: Yuan Chen, Shanghai (CN); Daihong Fu, Los Altos, CA (US); Jun Wu, Shanghai (CN)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 17/017,582

(22) Filed: Sep. 10, 2020

(65) Prior Publication Data

US 2020/0412308 A1 Dec. 31, 2020

Related U.S. Application Data

(63) Continuation of application No. 16/170,363, filed on Oct. 25, 2018, now Pat. No. 10,797,661.
(Continued)

(51) Int. Cl.
*H03F 3/38* (2006.01)
*H03F 3/387* (2006.01)
(Continued)

(52) U.S. Cl.
CPC .............. *H03F 3/387* (2013.01); *H03F 1/26* (2013.01); *H03F 3/45475* (2013.01);
(Continued)

(58) Field of Classification Search
CPC ...................................................... H03F 3/387
See application file for complete search history.

(56) References Cited

U.S. PATENT DOCUMENTS

| 4,896,156 A * | 1/1990 | Garverick | ............ G06G 7/1865 |
| | | | 332/106 |
| 5,287,107 A | 2/1994 | Gampell | |

(Continued)

OTHER PUBLICATIONS

Fan et al. (2011) "A 1.8 W 60 nV Hz Capacitively-Coupled Chopper Instrumentation Amplifier in 65 nm CMOS for Wireless Sensor Nodes," IEEE Journal of Solid-State Circuits, vol. 46, No. 7, Jul. 2011, 10 pp.

(Continued)

*Primary Examiner* — Patricia T Nguyen
(74) *Attorney, Agent, or Firm* — Lathrop GPM LLP

(57) ABSTRACT

A capacitive-coupled chopper instrumentation amplifier includes a first chopper, a first gain stage, a capacitive isolation stage electrically coupled between inputs of the first gain stage and the first chopper, a second gain stage, a second chopper electrically coupled between outputs of the first gain stage and inputs of the second gain stage, clamping circuitry electrically coupled between the inputs of the first gain stage and a reference voltage rail, and a controller. The controller is configured to (a) detect a change in a first common-mode voltage exceeding a threshold value, the first common-mode voltage being a common-mode voltage at the inputs of the amplifier, and (b) in response to detecting the change in the first common-mode voltage exceeding the threshold value, cause the clamping circuitry to clamp the inputs of the first gain stage to the reference voltage rail.

9 Claims, 24 Drawing Sheets

Related U.S. Application Data

(60) Provisional application No. 62/577,272, filed on Oct. 26, 2017, provisional application No. 62/577,261, filed on Oct. 26, 2017.

(51) Int. Cl.
*H03F 3/45* (2006.01)
*H03F 1/26* (2006.01)

(52) U.S. Cl.
CPC .. *H03F 2200/135* (2013.01); *H03F 2200/261* (2013.01); *H03F 2200/271* (2013.01); *H03F 2200/459* (2013.01)

(56) References Cited

U.S. PATENT DOCUMENTS

| | | | | |
|---|---|---|---|---|
| 6,028,312 | A | * | 2/2000 | Wadsworth ............... G01J 5/24 250/338.4 |
| 6,608,583 | B1 | * | 8/2003 | Konno ............... H03M 1/1295 341/124 |
| RE41,865 | E | * | 10/2010 | Choi .................... H04N 5/3575 250/208.1 |
| 8,896,377 | B1 | | 11/2014 | Shrestha |
| 9,143,092 | B2 | | 9/2015 | Huijsing et al. |
| 9,294,049 | B2 | | 3/2016 | Huijsing et al. |
| 10,003,306 | B1 | | 6/2018 | Larson et al. |
| 2009/0039956 | A1 | * | 2/2009 | Mo ........................... H03F 3/08 330/9 |
| 2009/0082691 | A1 | * | 3/2009 | Denison ................ A61B 5/374 600/544 |
| 2009/0115522 | A1 | | 5/2009 | Lyden et al. |
| 2013/0141163 | A1 | * | 6/2013 | Seven ..................... H04R 1/06 330/253 |
| 2013/0154718 | A1 | | 6/2013 | Huijsing et al. |
| 2013/0293294 | A1 | | 11/2013 | Lyden et al. |
| 2014/0232456 | A1 | * | 8/2014 | Huijsing ............. H03F 3/45071 330/9 |
| 2016/0006403 | A1 | | 1/2016 | Ivanov et al. |
| 2016/0065133 | A1 | | 3/2016 | Cong et al. |

OTHER PUBLICATIONS

Fan et al. (2012) "A Capacitively-Coupled Chopper Operational Amplifier with 3μV Offset and Outside-the-Rail Capability," 2012 IEEE, 4 pp.

Fan et al. (2013) "A Multi-Path Chopper-Stabilized Capacitively Coupled Operational Amplifier with 20V-Input-Common-Mode Range and 3μV Offset," 2013 IEEE International Solid-State Circuits Conference, 3 pp.

Saad et al. (2016) "A Chopper Capacitive Feedback Instrumentation Amplifier with Input Impedance Boosting Technique," 2016 IEEE 59th International Midwest Symposium on Circuits and Systems (MWSCAS), Oct. 16-19, 2016, Abu Dhabi, UAE, 4 pp.

\* cited by examiner

CAPACITIVE-COUPLED CHOPPER INSTRUMENTATION AMPLIFIERS AND ASSOCIATED METHODS

RELATED APPLICATIONS

This application is a continuation of U.S. patent application Ser. No. 16/170,363 filed on Oct. 25, 2018, which claims benefit of priority to U.S. Provisional Patent Application No. 62/577,272 filed on Oct. 26, 2017 and U.S. Provisional Patent Application No. 62/577,261 filed on Oct. 26, 2017. Each of the aforementioned applications is incorporated herein by reference.

BACKGROUND

Instrumentation amplifiers are capable of amplifying small differential voltages in the presence of large common-mode voltages. Consequentially, instrumentation amplifiers are often used in applications where a signal to be amplified is small and a common-mode voltage is large, such as in pressure sensing, temperature sensing, and current sensing applications.

An ideal instrumentation amplifier operates with infinite input impedance and zero voltage across its input. A practical instrumentation amplifier, however, falls short of these ideal characteristics. For example, a practical instrumentation amplifier will have a non-zero input offset voltage, where the input offset voltage is an inherent voltage across the instrumentation amplifier's input. Input offset voltage degrades instrumentation amplifier operation, and therefore, it is desirable that input offset voltage be as low as possible.

Some instrumentation amplifier applications require electrical isolation, such as to isolate the amplifier's electronic circuitry from a large common-mode input voltage. One example of such application is a high-side current sensing application, where a current sensing resistor is floating and voltage across the resistor has a large common-mode component that would be unsuitable for typical low-voltage amplifier circuitry.

One type of instrumentation amplifier capable of achieving low input offset voltage and electrical isolation is the capacitive-coupled chopper instrumentation amplifier (CCIA). FIG. 1 illustrates a conventional CCIA 100 including a first chopper 102, a second chopper 104, a capacitive isolation stage 106, a first gain stage 108, a second gain stage 110, reference resistors 112 and 114, and a controller 116. Capacitive isolation stage 106 is electrically coupled between first chopper 102 and first gain stage 108. Second chopper 104 is electrically coupled between first gain stage 108 and second gain stage 110. First and second reference resistors 112 and 114 are electrically coupled between a reference voltage rail 118 and respective inputs 120 and 122 of first gain stage 108. First reference resistor 112 and second reference resistor 114 are necessary to set a common-mode voltage at inputs 120 and 122 of first gain stage 108 because capacitive isolation stage 106 blocks transmission of a direct current (DC) component of an input signal to CCIA 100.

Controller 116 generates first and second clock signals $\phi_1$ and $\phi_2$ to control first and second choppers 102 and 104, such that first and second choppers 102 and 104 alternate between straight signal transmission and reverse signal transmission. Such operation of first and second choppers 102 and 104 shifts input offset voltage of first gain stage 108, as well as noise at inputs 120 and 122 of first gain stage 108, to a frequency greater than that of signals intended to be amplified by CCIA 100. Consequently, CCIA 100 may obtain low input offset voltage and low noise in a frequency range of signals intended to be amplified by CCIA 100.

DETAILED DESCRIPTION OF THE EMBODIMENTS

Figure 1:
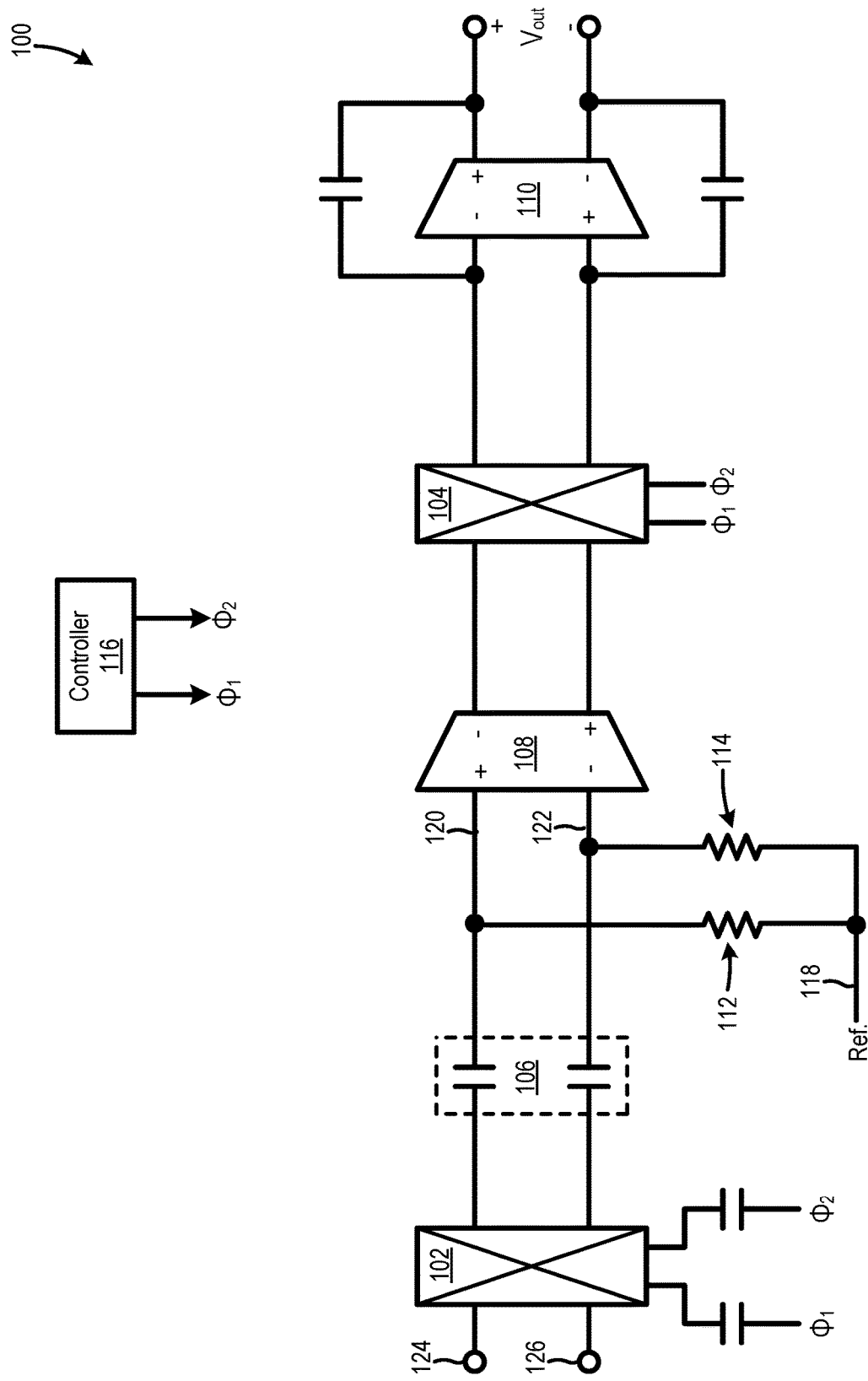
FIG. 1 illustrates a conventional CCIA.
Figure 2:
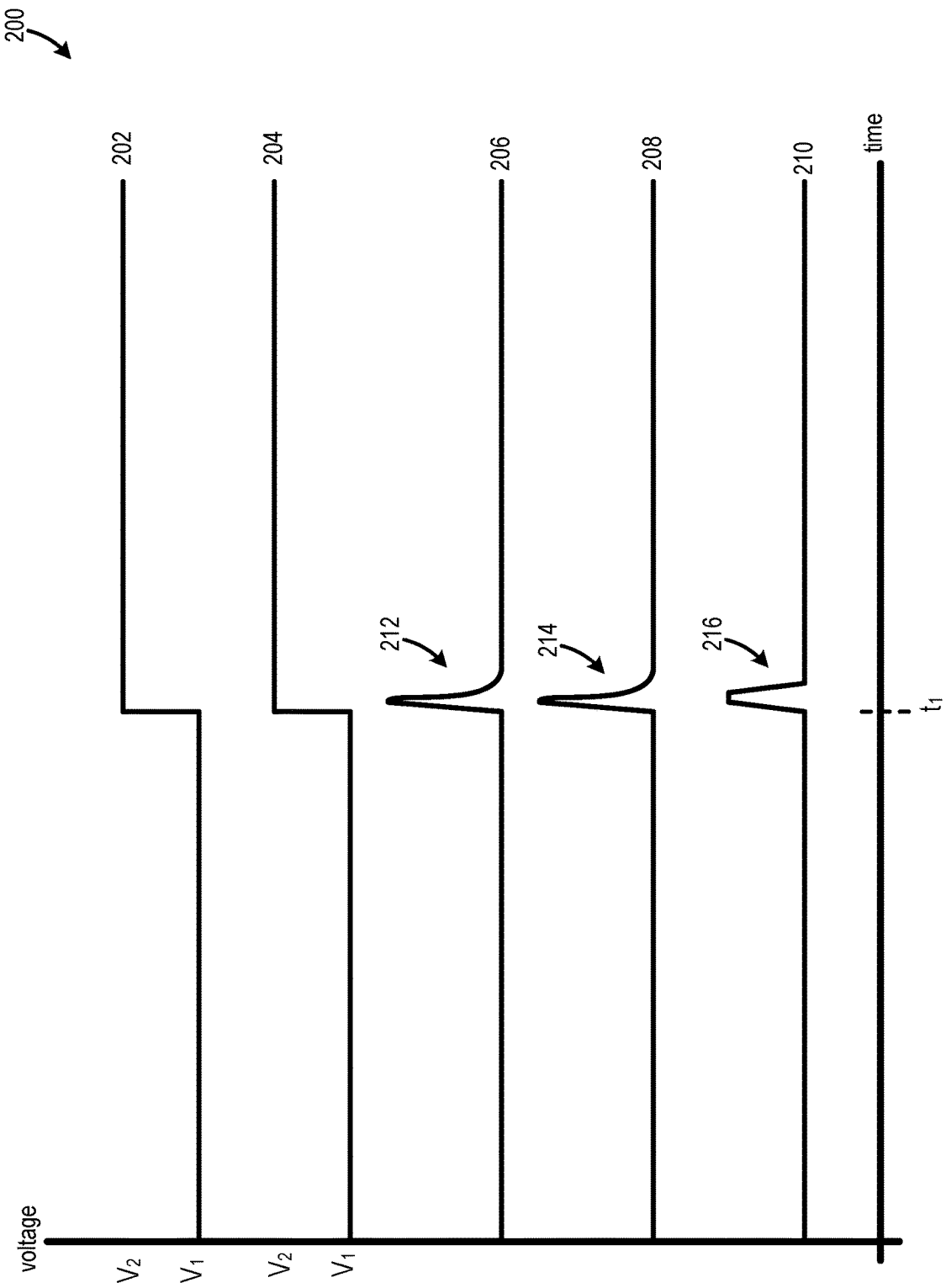
FIG. 2 is graph showing exemplary waveforms of the FIG. 1 CCIA in response to a quick change in a common-mode component of an input signal.

Conventional CCIAs perform poorly to quick changes in a common-mode component of their input signal. For example, FIG. 2 is a graph 200 showing exemplary waveforms of CCIA 100 in response to a quick change in common-mode voltage at inputs 124 and 126 of CCIA 100. Curve 202 represents voltage at CCIA input 124, curve 204 represents voltage at CCIA input 126, curve 206 represents voltage at first gain stage input 120, curve 208 represents voltage at first gain stage input 122, and curve 210 represents output voltage $V_{out}$ of CCIA 100.

At time $t_1$, magnitude of voltage at each of CCIA inputs 124 and 126 rapidly changes from $V_1$ to $V_2$, such that magnitude of common-mode voltage at the input of CCIA 100 rapidly changes from $V_1$ to $V_2$. First and second reference resistors 112 and 114 necessarily have large resistance values to prevent excessive signal loss and noise, and reference voltage rail 118 therefore acts as a high-impedance voltage source with respect to first gain stage inputs 120 and 122. Consequently, reference voltage rail 118 is unable to maintain common-mode voltage at first gain stage inputs 120 and 122 during transient events, and significant time is required for common-mode voltage at inputs 120 and 122 to settle after a transient event. Therefore, the quick change in common-mode input voltage at time $t_1$ causes glitches 212 and 214 to appear on each of first gain stage inputs 120 and 122, respectively, and these glitches are amplified by first and second gain stages 108 and 110 to causes a corresponding glitch 216 in output voltage $V_{out}$. Thus, the quick change in common-mode input voltage at time $t_1$ causes distortion in output voltage $V_{out}$.

Applicant has developed new CCIAs and associated methods which at least partially overcome one or more of the above-discussed drawbacks of conventional CCIAs. Certain embodiments of these new CCIAs are configured to repeatedly clamp common-mode voltage at a capacitively isolated portion of the CCIA, e.g., at gain stage inputs after a capacitive isolation stage, to a reference voltage of a reference voltage rail, thereby helping minimize common-mode voltage settling time after a transient event. Some embodiments are configured to detect a change in common-mode voltage, and in response to the detected change, (a) isolate a gain stage from amplifier inputs, and (b) clamp common-mode voltage at a capacitively isolated portion of the CCIA to a reference voltage, thereby helping minimize common-mode voltage settling time after a transient event.

Figure 3:
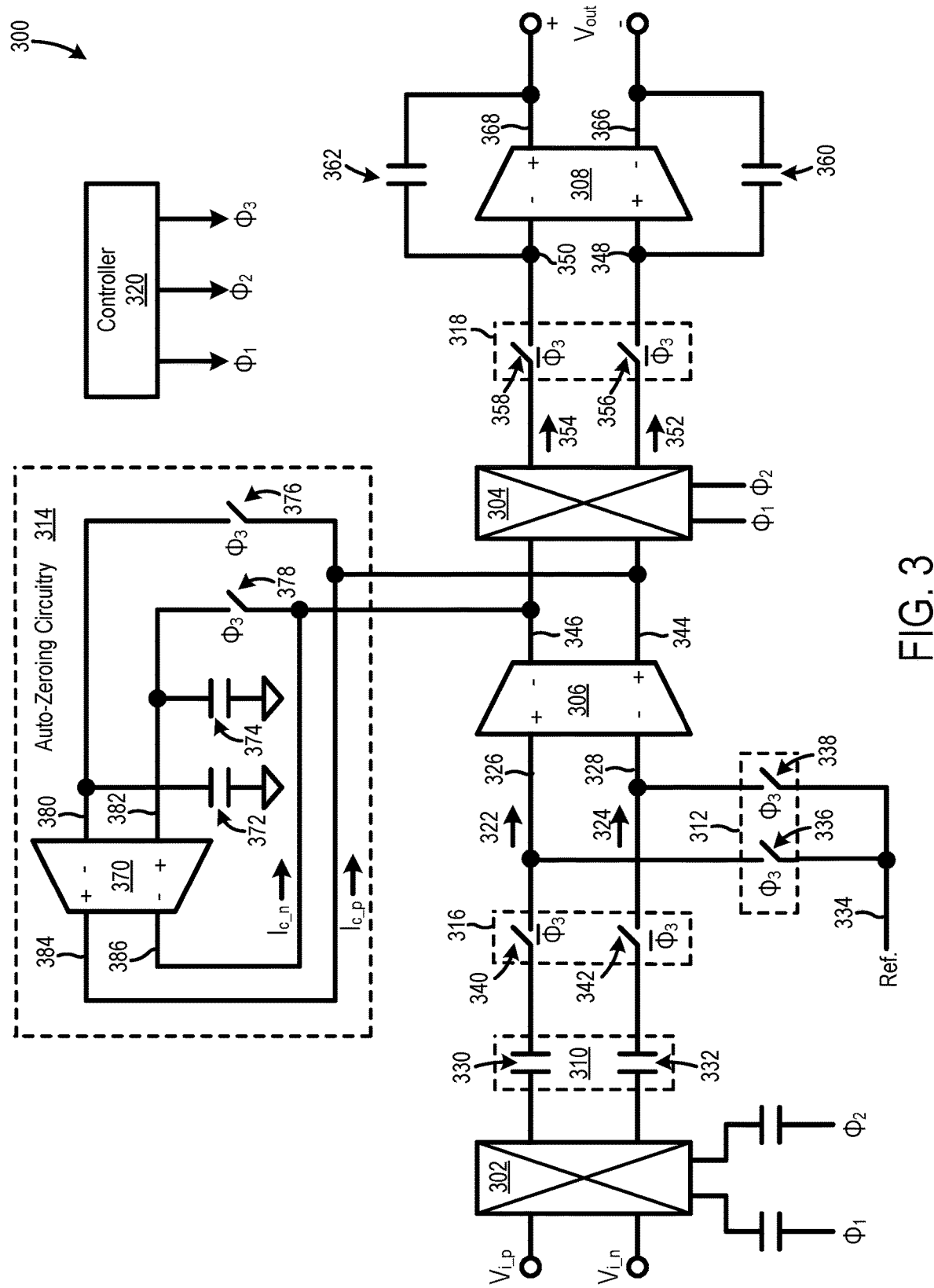
FIG. 3 illustrates a CCIA configured to repeatedly clamp common-mode voltage to a reference voltage, according to an embodiment.

FIG. 3 illustrates a CCIA 300, which is one embodiment of the new CCIAs configured to repeatedly clamp common-mode voltage at a capacitively isolated portion of the CCIA to reference voltage of a reference voltage rail. CCIA 300 includes a first chopper 302, a second chopper 304, a first gain stage 306, a second gain stage 308, a capacitive isolation stage 310, clamping circuitry 312, auto-zeroing circuitry 314, first switching circuitry 316, second switching circuitry 318, and a controller 320.

First chopper 302 is electrically coupled between (a) CCIA inputs $V_{i\_p}$ and $V_{i\_n}$ and (b) capacitive isolation stage 310. First chopper 302 is controlled by clock signals $\phi_1$ and $\phi_2$ and includes at least a first operating state and a second operating state. First chopper $\phi_1$ operates in its first operating state when clock signal $\phi_1$ is asserted, and first chopper 302 operates in its second operating state when clock signal $\phi_2$ is asserted. The first operating state is characterized by straight signal transmission, i.e., first chopper 302 electrically couples CCIA input $V_{i\_p}$ to a positive input path 322, and first chopper 302 electrically couples CCIA input $V_{i\_n}$ to a negative input path 324. The second operating state is characterized by reverse signal transmission, i.e., first chopper 302 electrically couples CCIA input $V_{i\_p}$ to negative input path 324, and first chopper 302 electrically couples CCIA input $V_{i\_n}$ to positive input path 322. Positive input path 322 feeds into an input 326 of first gain stage 306, and negative input path 324 feeds into an input 328 of first gain stage 306. In some embodiments, first chopper 302 includes a plurality of transistors (not shown) controlled by clock signals $\phi_1$ and $\phi_2$ to realize the first and second operating states.

Capacitive isolation stage 310 is electrically coupled between first chopper 302 and first gain stage inputs 326 and 328, such that first gain stage 306 is communicatively coupled with capacitive isolation stage 310. Capacitive isolation stage 310 electrically couples alternating current (AC) signals between first chopper 302 and first gain stage 306 while blocking transmission of DC signals. In some embodiments, capacitive isolation stage 310 includes a first capacitor 330 and a second capacitor 332, as illustrated. In these embodiments, first capacitor 330 is electrically coupled in series with positive input path 322, and second capacitor 332 is electrically coupled in series with negative input path 324. Capacitive isolation stage 310 could include additional capacitors without departing from the scope hereof. Additionally, capacitive isolation stage 310 could be replaced with another device transmitting only AC signals, such as an optocoupler.

Clamping circuitry 312 is electrically coupled between first gain stage inputs 326 and 328 and a reference voltage rail 334. In certain embodiments, reference voltage rail 334 has a fixed electrical potential that is set to achieve a desired common-mode voltage at first gain stage inputs 326 and 328. Clamping circuit 312 is configured to clamp first gain stage inputs 326 and 328 to reference voltage rail 334 when clock signal $\phi_3$ is asserted, thereby clamping common-mode voltage at first gain stage inputs 326 and 328 to a reference voltage of reference voltage rail 334. As discussed below, clamping circuitry 312 repeatedly clamps first gain stage inputs 326 and 328 to reference voltage rail 334 to help minimize common-mode voltage settling time after a transient event. In certain embodiments, clamping circuitry 312 includes switching devices 336 and 338 electrically coupled between reference voltage rail 334 and first gain stage inputs 326 and 328, respectively, as illustrated. Switching devices 336 and 338 are closed when clock signal $\phi_3$ is asserted, to respectively clamp first gain stage inputs 326 and 328 to reference voltage rail 334. Switching devices 336 and 338 are open when clock signal $\phi_3$ is de-asserted. Each of switching devices 336 and 338 includes one or more transistors, for example. The configuration of clamping circuitry 312 could be varied, such as to include additional switching devices, without departing from the scope hereof.

First switching circuitry 316 is configured to electrically isolate first gain stage inputs 326 and 328 from CCIA inputs $V_{i\_p}$ and $V_{i\_n}$ when clamping circuitry 312 clamps first gain stage inputs 326 and 328 to reference voltage rail 334, i.e., when clock signal $\phi_3$ is asserted. In certain embodiments, first switching circuitry 316 includes a respective switching device 340 and 342 electrically coupled in series with positive input path 322 and negative input path 324, as illustrated. Switching devices 340 and 342 are closed when clock signal $\phi_3$ is de-asserted, and switching devices 340 and 342 are open when clock signal $\phi_3$ is asserted. Each of switching devices 340 and 342 includes one or more transistors, for example. Although first switching circuitry 316 is illustrated as being electrically coupled between capacitive isolation stage 310 and first gain stage 306, first switching circuitry 316 could alternately be electrically coupled between first chopper 302 and capacitive isolation stage 310.

In particular embodiments, first gain stage 306 performs a transconductance function, i.e., it generates differential output current signals in response to a difference in input voltage signals. However, the configuration of first gain stage 306 could vary without departing from the scope hereof. Although first gain stage 306 is illustrated as a single element for illustrative simplicity, first gain stage 306 may include a plurality of elements.

Second chopper 304 is electrically coupled between outputs 344 and 346 of first gain stage 306 and inputs 348 and 350 of second gain stage 308. Second chopper 304 is controlled by clock signals $\phi_1$ and $\phi_2$ in a manner like that of first chopper 302. In particular, second chopper 304 operates in its first operating state when clock signal $\phi_1$ is asserted, and second chopper 304 operates in its second operating state when clock signal $\phi_2$ is asserted. The first operating state is characterized by straight signal transmission, i.e., second chopper 304 electrically couples first gain stage output 344 to a positive output path 352, and second chopper 304 electrically couples first gain stage output 346 to a negative output path 354. The second operating state is characterized by reverse signal transmission, i.e., second chopper 304 electrically couples first gain stage output 344 to negative output path 354, and second chopper 304 electrically couples first gain stage output 346 to positive output path 352. Positive output path 352 feeds into second gain stage input 348, and negative output path 354 feeds into second gain stage input 350. In some embodiments, second chopper 304 includes a plurality of transistors (not shown) controlled by clock signals $\phi_1$ and $\phi_2$ to realize the first and second operating states.

Second switching circuitry 318 is configured to electrically isolate second gain stage inputs 348 and 350 from first gain stage outputs 344 and 346 when clamping circuitry 312 clamps first gain stage inputs 326 and 328 to reference voltage rail 334, i.e., when clock signal $\phi_3$ is asserted. In certain embodiments, second switching circuitry 318 includes a respective switching device 356 and 358 electrically coupled in series with positive output path 352 and with negative output path 354, as illustrated. Switching devices 356 and 358 are closed when clock signal $\phi_3$ is de-asserted, and switching devices 356 and 358 are open when clock signal $\phi_3$ is asserted. Each of switching devices 356 and 358 includes one or more transistors, for example. Although second switching circuitry 318 is illustrated as being electrically coupled between second chopper 304 and second gain stage 308, second switching circuitry 318 could alternately be electrically coupled between first gain stage 306 and second chopper 304.

In particular embodiments, second gain stage 308 performs a transconductance function, and CCIA 300 further includes feedback capacitors 360 and 362, as illustrated. Feedback capacitor 360 is electrically coupled between second gain stage input 348 and an output 366 of second gain stage 308. Feedback capacitor 362 is electrically coupled between second gain stage input 350 and an output 368 of second gain stage 308. Accordingly, second gain stage 308 is miller-compensated. The configuration of second gain stage 308 could vary, though, without departing from the scope hereof. Although second gain stage 308 is illustrated as a single element for illustrative simplicity, second gain stage 308 may include a plurality of elements without departing from the scope hereof.

Auto-zeroing circuitry 314 is electrically coupled to first gain stage outputs 344 and 346. Auto-zeroing circuitry 314 includes a third gain stage 370, auto-zeroing capacitors 372 and 374, and auto-zeroing switching devices 376 and 378. Auto-zeroing capacitors 372 and 374 are electrically coupled to first gain stage outputs 344 and 346 via auto-zeroing switching devices 376 and 378, respectively. Auto-zeroing capacitors 372 and 374 are also electrically coupled to third gain stage inputs 380 and 382, respectively. Outputs 384 and 386 of third gain stage 370 are electrically coupled to first gain stage outputs 344 and 346, respectively. Auto-zeroing switching devices 376 and 378 are controlled by clock signal $\phi_3$, i.e., auto-zeroing switching devices 376 and 378 are closed when clock signal $\phi_3$ is asserted, and auto-zeroing switching devices 376 and 378 are open when clock signal $\phi_3$ is de-asserted. Each of auto-zeroing switching devices 376 and 378 includes one or more transistors, for example. As discussed below, auto-zeroing circuitry 314 injects current at first gain stage outputs 344 and 346 to compensate for output ripple induced by first and second choppers 302 and 304.

Controller 320 generates first clock signal $\phi_1$, second clock signal $\phi_2$, and third clock signal $\phi_3$. Controller 320 is formed, for example, of analog electrical circuitry, digital electrical circuitry, or a combination of analog and digital electrical circuitry. For example, in one embodiment, controller 320 is formed of a processor and interface circuitry, where the interface circuitry electrically couples the processor to the choppers and the switching devices of CCIA 300. In this embodiment, the processor executes instructions in the form of software or firmware to generate first clock signal $\phi_1$, second clock signal $\phi_2$, and third clock signal $\phi_3$. Although controller 320 is symbolically illustrated as a single element, controller 320 could be formed of multiple elements, such as multiple integrated circuits and/or multiple discrete components.

In certain embodiments, controller 320 generates first clock signal $\phi_1$ and second clock signal $\phi_2$ such that first clock signal $\phi_1$ and second clock signal $\phi_2$ are asserted in a complementary manner, i.e., first clock signal $\phi_1$ is asserted when second clock signal $\phi_2$ is de-asserted, and vice versa. Consequently, first and second choppers 302 and 304 repeatedly switch between their respective first and second operating states in unison, in these embodiments. Controller 320 asserts third clock signal $\phi_3$ at least once during each time that first clock signal $\phi_1$ is asserted, and controller 320 also asserts third clock signal $\phi_3$ at least once during each time that second clock signal $\phi_2$ is asserted, such that third clock signal $\phi_3$ is asserted at least once during each chopper cycle. Consequently, clamping circuitry 312 clamps first gain stage inputs 326 and 328 to reference voltage rail 334 at least once during each time that first and second choppers 302 and 304 operate in their respective first operating states, and clamping circuitry 312 clamps first gain stage inputs 326 and 328 to reference voltage rail 334 at least once during each time that first and second choppers 302 and 304 operate in their respective second operating states.

Figure 4:
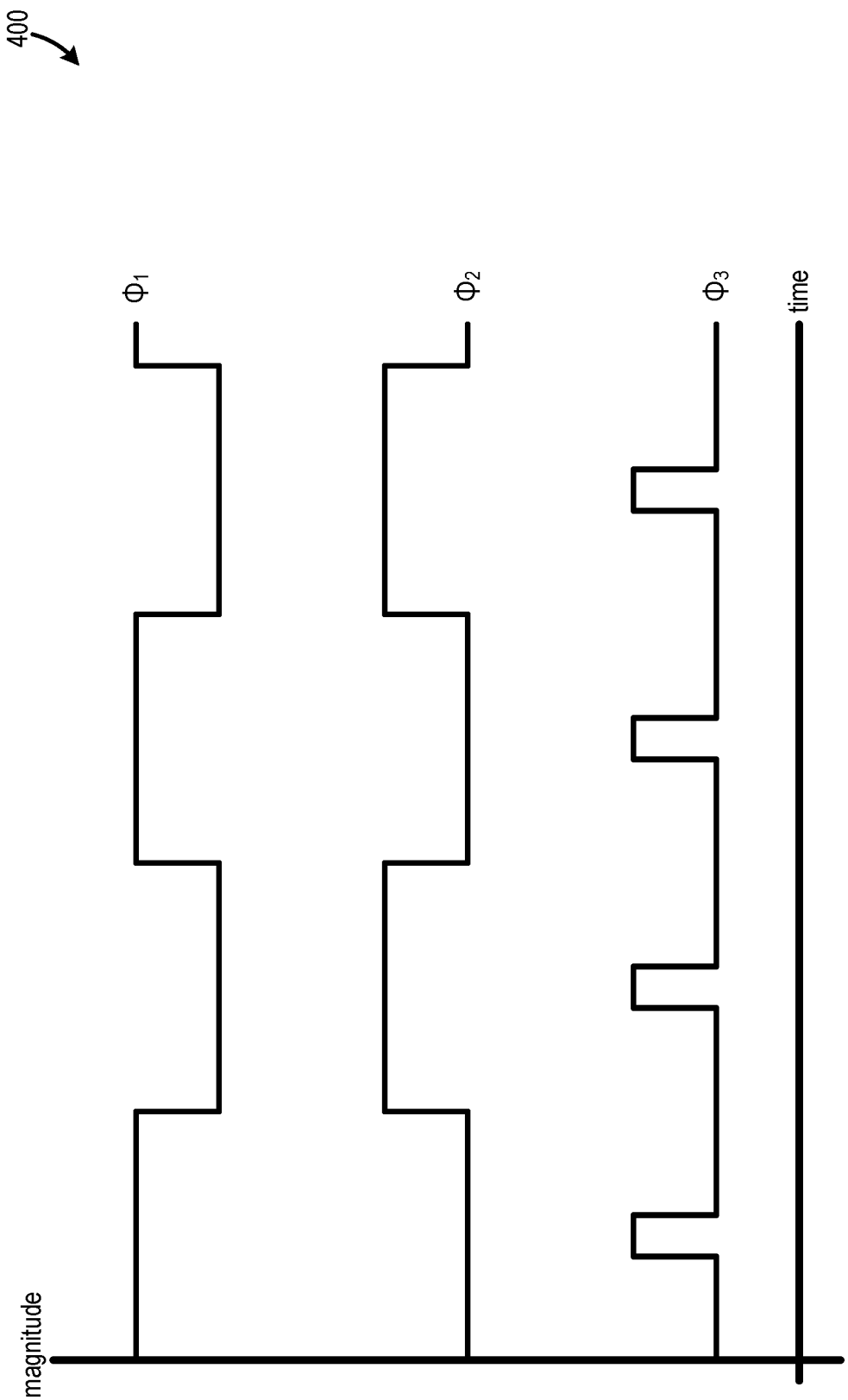
FIG. 4 is a graph illustrating signals in one embodiment of the FIG. 3 CCIA.

FIG. 4 is a graph 400 illustrating first, second, and third clock signals $\phi_1$, $\phi_2$, and $\phi_3$ as generated by controller 320 in one embodiment of CCIA 300. The vertical axis of graph 400 represents signal magnitude, and the horizontal axis of graph 400 represents time. In this particular embodiment, the clock signals are asserted when they are logic high. However, CCIA 300 could be configured such that one or more of first, second, and third clock signals $\phi_1$, $\phi_2$, and $\phi_3$ are asserted when they are logic low, without departing from the scope hereof.

In the FIG. 4 embodiment, first and second clock signals $\phi_1$ and $\phi_2$ are asserted in a complementary manner. Consequently, input offset voltage of first gain stage 306 and noise at first gain stage inputs 326 and 328 are shifted to a high frequency. Additionally, third clock signal $\phi_3$ is asserted once during each time that first clock signal $\phi_1$ is asserted, and third clock signal $\phi_3$ is also asserted once during each time that second clock signal $\phi_2$ is asserted. As a result, clamping circuitry 312 repeatedly clamps common-mode voltage at a capacitively isolated portion of CCIA 300, i.e., at first gain stage inputs 326 and 328, to a reference voltage of reference voltage rail 334, to repeatedly "reset" the common-mode voltage. Therefore, first gain stage inputs 326 and 328 are significantly less prone to developing glitches from transient events than conventional CCIAs because common-mode voltage at first gain stage inputs 326 and 328 is frequently reset. Consequently, CCIA 300 is advantageously significantly less prone to glitches from common-mode transient events than conventional CCIAs.

Additionally, auto-zeroing circuitry 314 leverages clamping circuitry 312 to help minimize output ripple associated with operation of first and second choppers 302 and 304. In particular, clamping circuitry 312 electrically shorts first gain stage inputs 326 and 328 together when third clock signal $\phi_3$ is asserted, and first gain stage outputs 344 and 346 therefore ideally have a common value when third clock signal $\phi_3$ is asserted. Auto-zeroing circuitry 314 takes advantage of first gain stage inputs 326 and 328 being electrically shorted together by sampling first gain stage outputs 344 and 346 when third clock signal $\phi_3$ is asserted, i.e., when clamping circuiting 312 clamps first gain stage inputs 326 and 328 to reference voltage rail 334, to determine presence of ripple on first gain stage outputs 344 and 346 which is associated with operation of first and second choppers 302 and 304. Specifically, auto-zeroing switching devices 376 and 378 are closed when third clock signal $\phi_3$ is asserted, and auto-zeroing capacitors 372 and 374 are charged to respective voltages of first gain stage outputs 344 and 346. Third gain stage 370 amplifies a difference in voltage of auto-zero capacitors 372 and 374 to generate compensation currents $I_{c\_p}$ and $I_{c\_n}$, respectively. Compensation currents $I_{c\_p}$ and $I_{c\_n}$, are injected at first gain stage outputs 344 and 346 to compensate for output ripple associated with operation of first and second choppers 302 and 304. Accordingly, the combination of auto-zeroing circuitry 314 and clamping circuitry 312 enables certain embodiments of CCIA 300 to achieve lower output ripple than conventional CCIAs.

Figure 5:
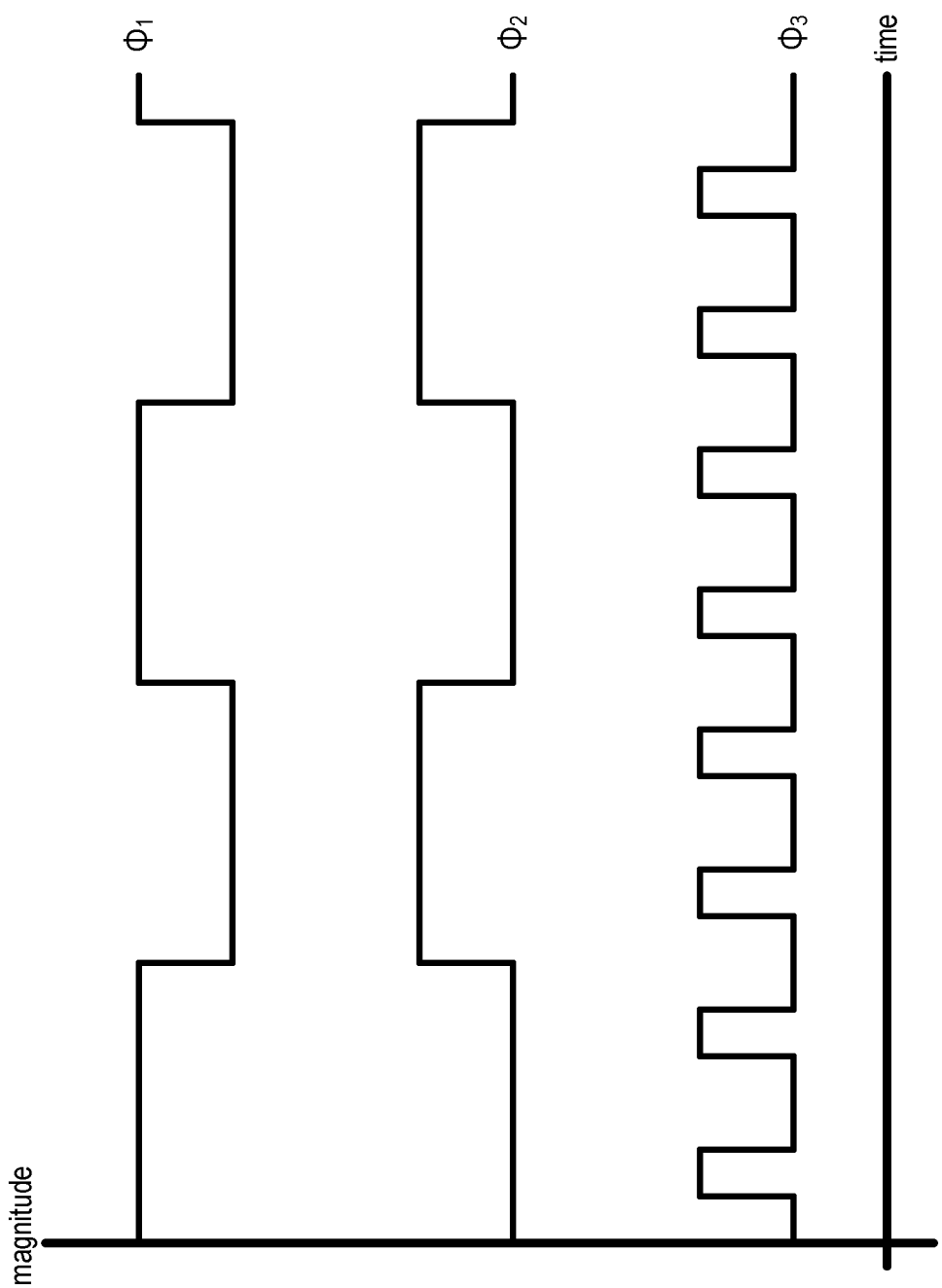
FIG. 5 is a graph illustrating signals in another embodiment of the FIG. 3 CCIA.

Increasing frequency of third clock signal $\phi_3$ assertion increases AC common-mode rejection ratio (CMRR) of CCIA 300. Accordingly, in some embodiments, controller 320 generates third clock signal $\phi_3$ such that third clock signal $\phi_3$ is asserted at least twice during each time that first clock signal $\phi_1$ is asserted and such that third clock signal $\phi_3$ is asserted at least twice during each time that second clock signal $\phi_2$ is asserted. Stated differently, third clock signal $\phi_3$ is asserted at least twice during each chopper cycle. For example, FIG. 5 is a graph 500 analogous to the FIG. 4 graph but illustrating clock signals of an alternate embodiment of CCIA 300 where third clock signal $\phi_3$ is asserted twice during each time that first clock signal $\phi_1$ is asserted and twice during each time that second clock signal $\phi_2$ is asserted. Controller 320 could be modified to assert third clock signal $\phi_3$ additional times per chopper cycle to even further increase CMRR of CCIA 300.

Figure 6:
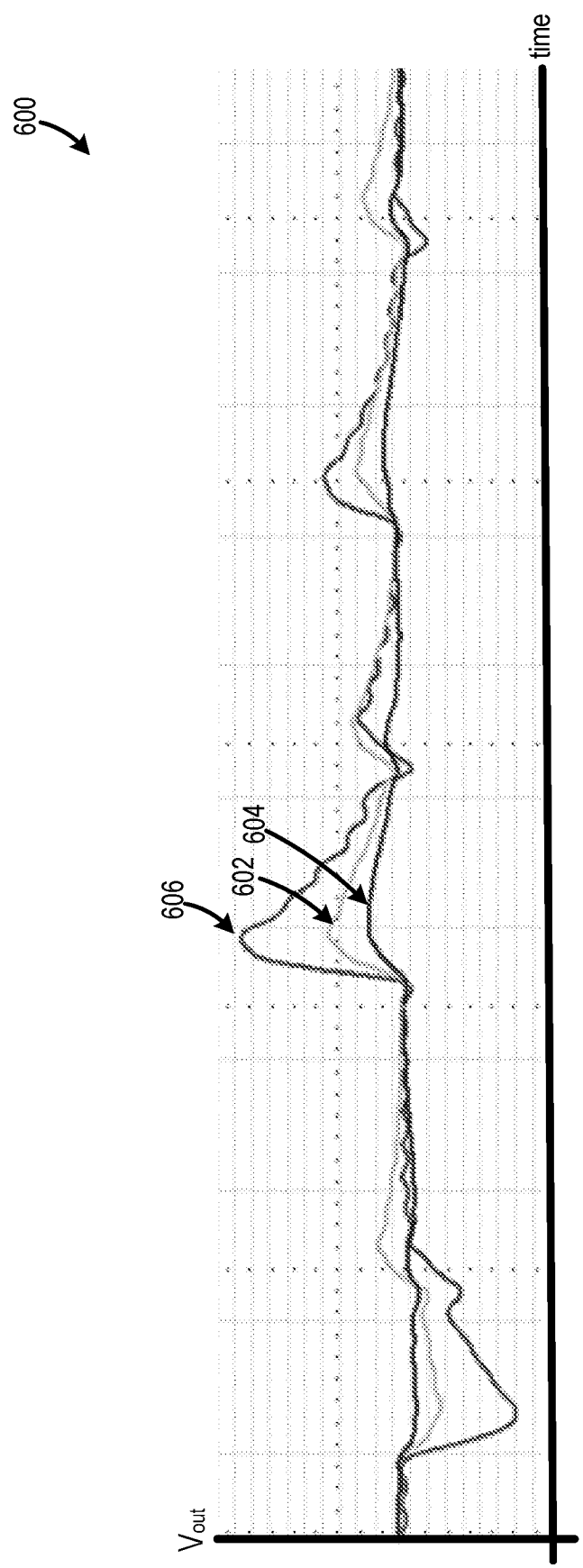
FIG. 6 is a graph of simulated output voltage of several embodiments of the FIG. 3 CCIA.

FIG. 6 is a graph 600 of simulated output voltage $V_{out}$ of several embodiments of CCIA 300 in response to a fifty volt change in common-mode input voltage. The vertical axis of graph 600 represents output voltage $V_{out}$, and the horizontal axis of graph 600 represents time. Curve 602 corresponds to an embodiment of CCIA 300 where clock signals are generated in a manner like that of FIG. 4, and curve 604 corresponds to an embodiment of CCIA 300 where clock signals are generated in a manner like that of FIG. 5. Curve 606, in turn, corresponds to clamping circuitry 312 being omitted from CCIA 300. As evident from FIG. 6, inclusion of clamping circuitry 312 in CCIA 300 significantly reduces output voltage distortion in response to a common-mode input transient event, and increasing frequency of third clock signal $\phi_3$ assertion further reduces output voltage distortion.

Figure 7:
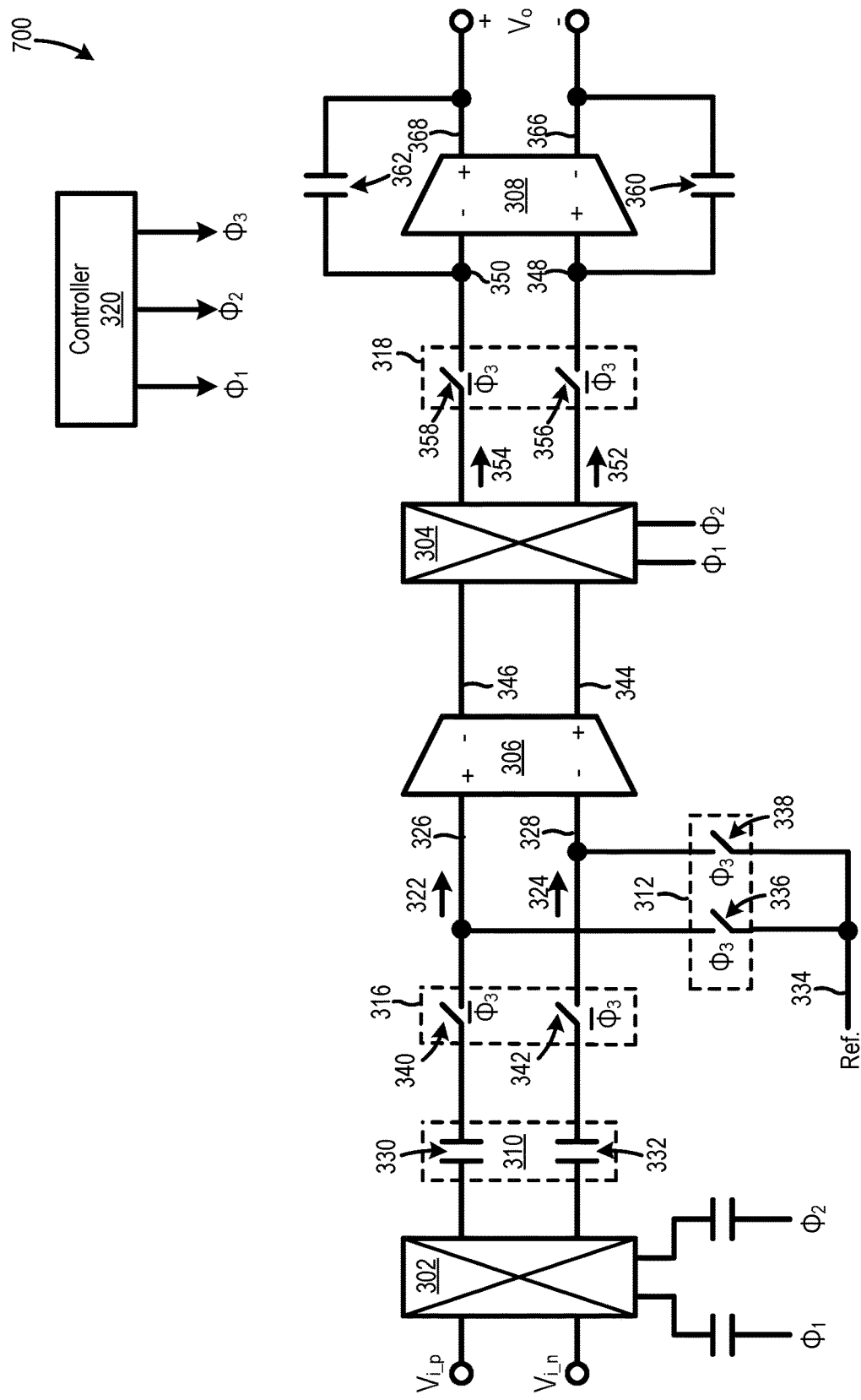
FIG. 7 illustrates a CCIA like that of FIG. 3 but with auto-zeroing circuitry omitted, according to an embodiment.

Auto-zeroing circuitry 314 could be omitted from CCIA 300 to reduce cost and complexity, with the drawback of increased output ripple. For example, FIG. 7 illustrates a CCIA 700 which is like CCIA 300 but with auto-zeroing circuitry 314 omitted.

One possible application of the instrumentation amplifiers disclosed herein is in current sensing applications, such as for sensing current flowing through an inductive load, e.g. a motor or a solenoid, driven by a pulse width modulation (PWM) voltage or a pulse frequency modulated (PFM) voltage. Current sensing measurements in these applications often must be very accurate, such as to ensure proper control of the inductive load. However, it is difficult to accurately sense current in these applications because a current sensing amplifier must be capable of sensing a small differential voltage, e.g., in the millivolt range, superimposed on a large PWM or PFM common-mode voltage, e.g., in the tens of volts range. Additionally, the PWM or PFM common-mode voltage may have an edge slew rate of up to 500 volts per microsecond, which can distort the output of a conventional instrumentation amplifier, as discussed above. Clamping circuitry 312 in certain embodiments of CCIA 300, however, causes CCIA 300 to have a large CMRR, thereby enabling CCIA 300 to substantially reject PWM and PFM common-mode voltage in current sensing applications. Consequently, certain embodiments of CCIA 300 may enable accurate current sensing in applications where an inductive load is driven by a PWM or PFM voltage.

Figure 8:
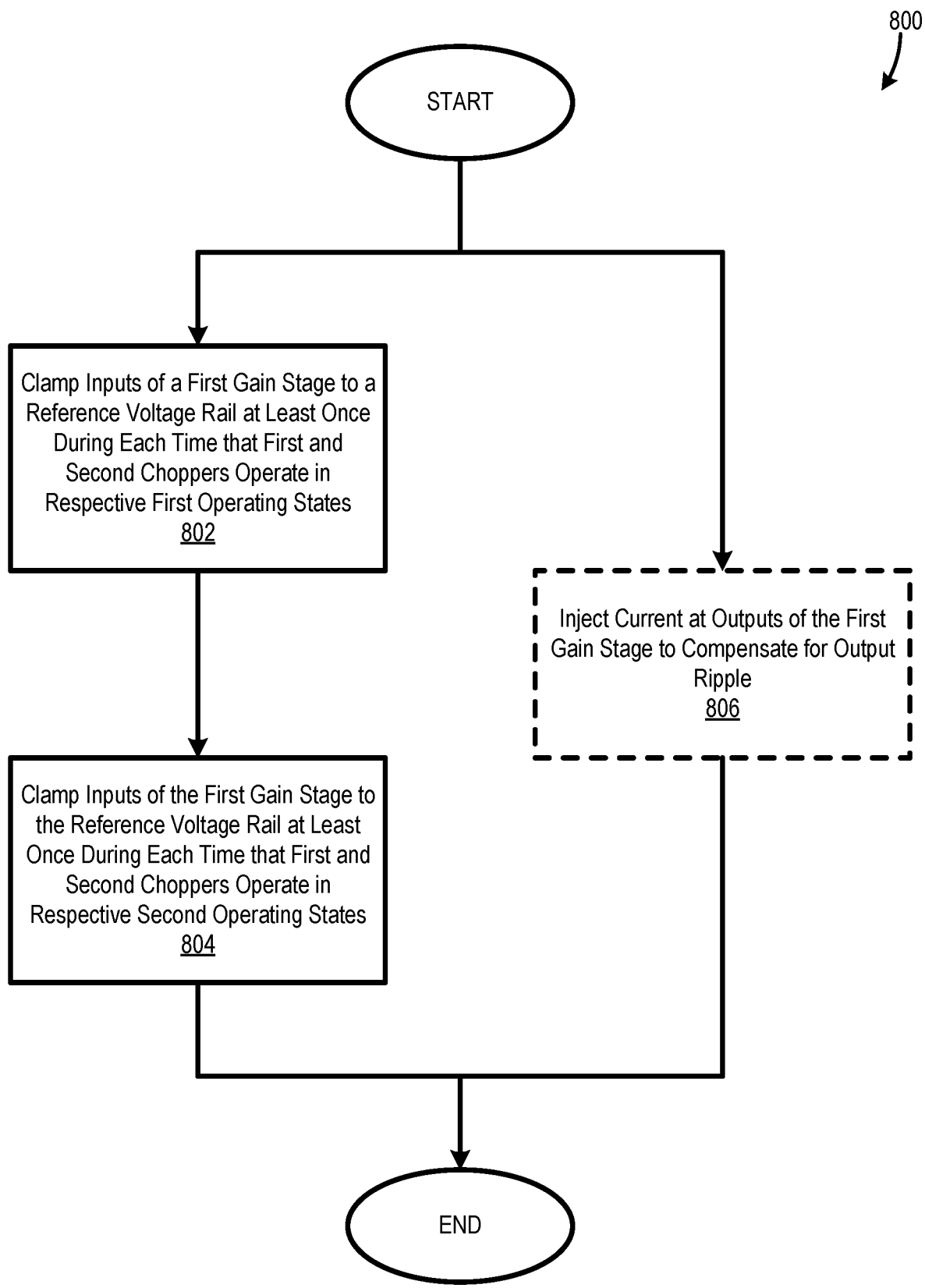
FIG. 8 illustrates a method for reducing common-mode settling time of a CCIA, according to an embodiment.

FIG. 8 illustrates a method 800 for reducing common-mode settling time of a CCIA. In step 802, inputs of a first gain stage of the CCIA are clamped to a reference voltage rail at least once during each time that first and second choppers of the CCIA operate in respective first operating states. In one example of step 802, clamping circuitry 312 clamps first gain stage inputs 326 and 328 to reference voltage rail 334 at least once during each time that first and second choppers 302 and 304 operate in their respective first operating states. In step 804, the inputs of the first gain stage of the CCIA are clamped to the reference voltage rail at least once during each time that the first and second choppers of the CCIA operate in respective second operating states. In one example of step 804, clamping circuitry 312 clamps first gain stage inputs 326 and 328 to reference voltage rail 334 at least once during each time that first and second choppers 302 and 304 operate in their respective second operating states.

Method 800 optionally further includes a step 806 where current is injected at outputs of the first gain stage to compensate for output ripple induced by the first and second choppers. Step 806 is, for example, executed in parallel with steps 802 and 804. In one example of step 806, third gain stage 370 injects compensation currents $I_{c\_p}$ and $I_{c\_n}$ at first gain stage outputs 344 and 346 to compensate for output ripple induced by first and second choppers 302 and 304. Outputs 344 and 346 of first gain stage 306 are sampled when clamping first gain stage inputs 326 and 328 to reference voltage rail 334, for example, to determine magnitude of compensation currents $I_{c\_p}$ and $I_{c\_n}$.

Applicant has further determined that the principle of repeatedly clamping common-mode voltage in a capacitively-isolated amplifier to a reference voltage, to help minimize common-mode voltage settling time after a transient event, is not limited to CCIAs. Instead, the principle can be applied to many other capacitive-coupled amplifiers. Discussed below with respect to FIGS. 9-12 are several examples of how the principle of repeatedly clamping common-mode voltage to a reference voltage can be applied to amplifiers other than a CCIA. It should be appreciated, however, that this principle is not limited to the particular topologies discussed herein but can instead be applied to many other capacitively-coupled amplifiers.

Figure 9:
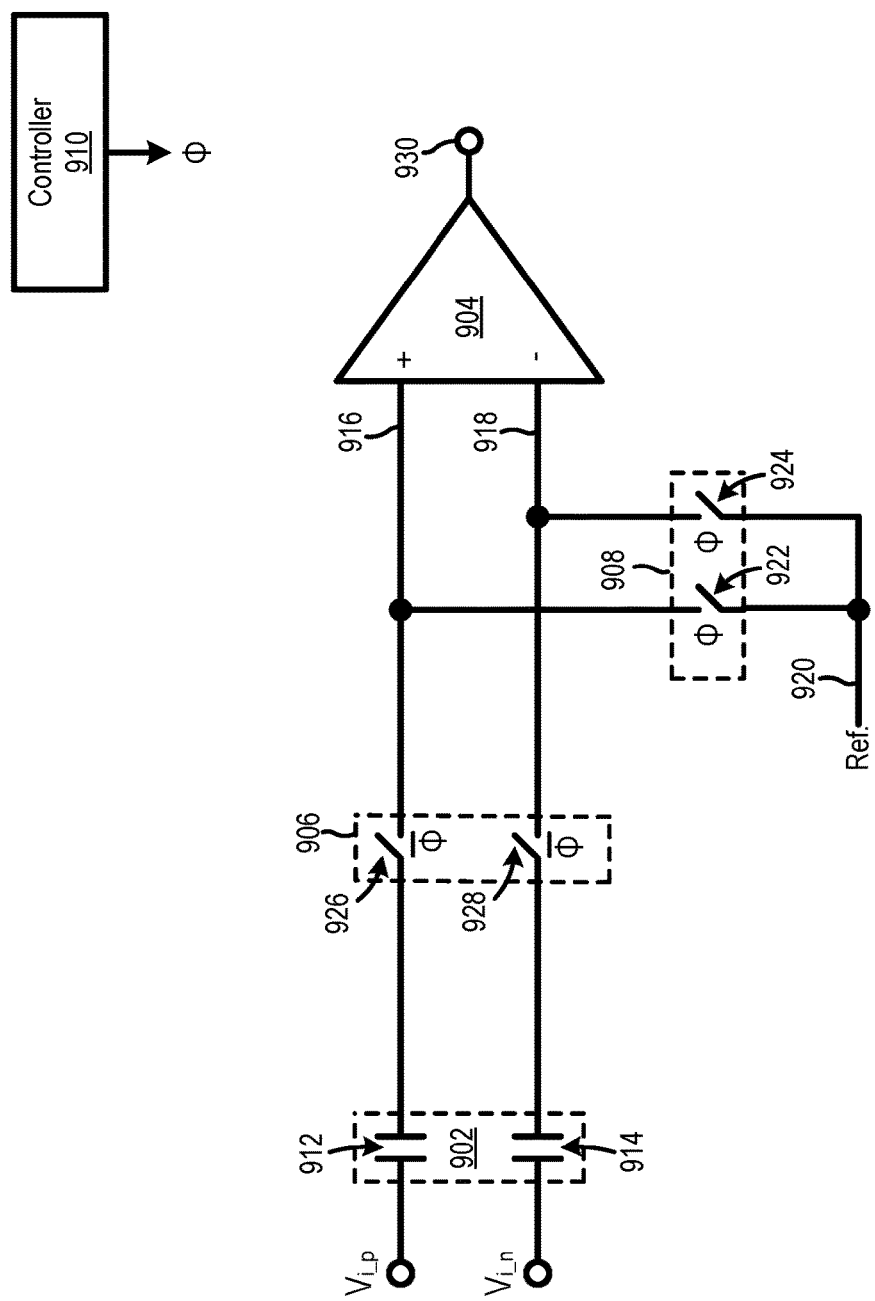
FIG. 9 illustrates a capacitive-coupled linear amplifier that is configured to repeatedly clamp common-mode voltage to a reference voltage, according to an embodiment.

FIG. 9 illustrates a capacitive-coupled linear amplifier 900 that is configured to repeatedly clamp common-mode voltage at a capacitively-isolated portion of the amplifier to a reference voltage. Amplifier 900 includes a capacitive isolation stage 902, a gain stage 904, switching circuitry 906, clamping circuitry 908, and a controller 910. Capacitive isolation stage 902 includes a first capacitor 912 and a second capacitor 914. First capacitor 912 is electrically coupled between an amplifier input $V_{i\_p}$ and an input 916 of gain stage 904, and second capacitor 914 is electrically coupled between an amplifier input $V_{i\_n}$ and an input 918 of gain stage 904, such that gain stage 904 is communicatively coupled to capacitive isolation stage 902. Capacitive isolation stage 902 electrically couples AC signals between amplifier inputs $V_{i\_p}$ and $V_{i\_n}$ and gain stage inputs 916 and 918 while blocking transmission of DC signals. Capacitive isolation stage 902 could include additional capacitors without departing from the scope hereof. Additionally, capacitive isolation stage 902 could be replaced with another device transmitting only AC signals, such as an optocoupler.

Clamping circuitry 908 is electrically coupled between gain stage inputs 916 and 918 and a reference voltage rail 920. In certain embodiments, reference voltage rail 920 has a fixed electrical potential that is set to achieve a desired common-mode voltage at gain stage inputs 916 and 918. Clamping circuitry 908 is configured to clamp gain stage inputs 916 and 918 to reference voltage rail 920 when a clock signal $\phi$ is asserted, thereby clamping common-mode voltage to a reference voltage of reference voltage rail 920. As discussed below, controller 910 repeatedly asserts clock signal $\phi$ to help minimize common-mode voltage settling time after a transient event. In certain embodiments, clamping circuitry 908 includes switching devices 922 and 924 electrically coupled between reference voltage rail 920 and gain stage inputs 916 and 918, respectively, as illustrated. Switching devices 922 and 924 are closed when clock signal $\phi$ is asserted, to respectively clamp gain stage inputs 916 and 918 to reference voltage rail 920. Switching devices 922 and 924 are open when clock signal $\phi$ is de-asserted. Each of switching devices 922 and 924 includes one or more transistors, for example. The configuration of clamping circuitry 908 could be varied, such as to include additional switching devices, without departing from the scope hereof.

Switching circuitry 906 is configured to electrically isolate gain stage 904 from amplifier inputs $V_{i\_p}$ and $V_{i\_n}$ when clamping circuitry 908 clamps common-mode-voltage to the voltage of reference voltage rail 920, i.e., when clock signal $\phi$ is asserted. In certain embodiments, switching circuitry 906 includes a respective switching device 926 and 928 electrically coupled in series with gain stage inputs 916 and 918, as illustrated. Switching devices 926 and 928 are closed when clock signal $\phi$ is de-asserted, and switching devices 926 and 928 are open when clock signal $\phi$ is asserted. Each of switching devices 926 and 928 includes one or more transistors, for example.

Gain stage 904 can have essentially any configuration as long as it generates a signal at a gain stage output 930 in response to a difference in signals at gain stage inputs 916 and 918. For example, in some embodiments, gain stage 904 is configured as an instrumentation amplifier. Although gain stage 904 is illustrated as a single element for illustrative simplicity, gain stage 904 may include multiple elements. The signal at gain stage output 930 could be a voltage signal or a current signal, depending on the configuration of gain stage 904. The signal at gain stage output 930 is a differential signal in some embodiments of amplifier 900.

Controller 910 generates clock signal $\phi$ such that clock signal $\phi$ is repeatedly asserted. As a result, clamping circuitry 908 repeatedly clamps gain stage inputs 916 and 918 to reference voltage rail 920. Therefore, gain stage inputs 916 and 918 are significantly less prone to developing glitches from transient events than conventional CCIAs because common-mode voltage at gain stage inputs 916 and 918 is frequently reset to the reference voltage of reference voltage rail 920. Consequently, for reasons similar to those discussed above with respect to CCIA 300, amplifier 900 is advantageously significantly less prone to glitches from common-mode transient events than conventional capacitive-coupled differential amplifiers.

Figure 10:
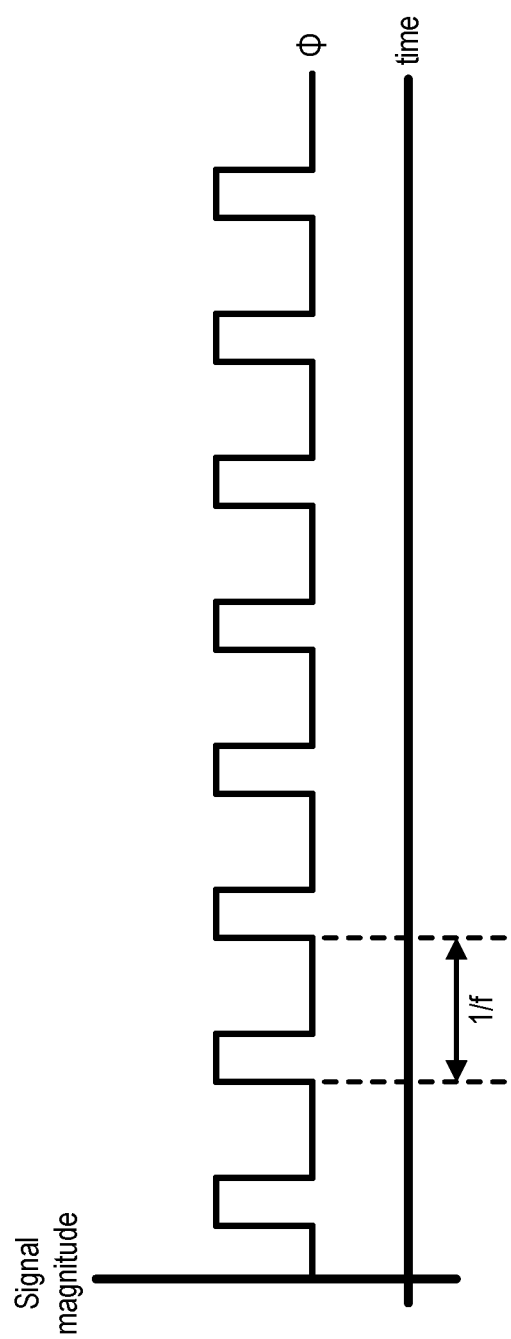
FIG. 10 is a graph illustrating a clock signal in one embodiment of the FIG. 9 amplifier.

FIG. 10 is a graph 1000 illustrating clock signal $\phi$ as generated by controller 910 in one embodiment of amplifier 900. The vertical axis of graph 1000 represents signal magnitude, and the horizontal axis of graph 1000 represents time. In this particular embodiment, clock signal $\phi$ is asserted when it is logic high. However, amplifier 1000 could be configured such that clock signal $\phi$ is asserted when it is logic low, without departing from the scope hereof. Controller 910 asserts clock signal $\phi$ at a frequency f in the FIG. 10 embodiment. However, controller 910 could be modified to assert clock signal $\phi$ at a different frequency, or even in a non-periodic manner, without departing from the scope hereof. CMRR of amplifier 900 generally increases with increasing frequency f, and therefore, it may be desirable to configure controller 910 such that frequency f is as large as practical.

Figure 11:
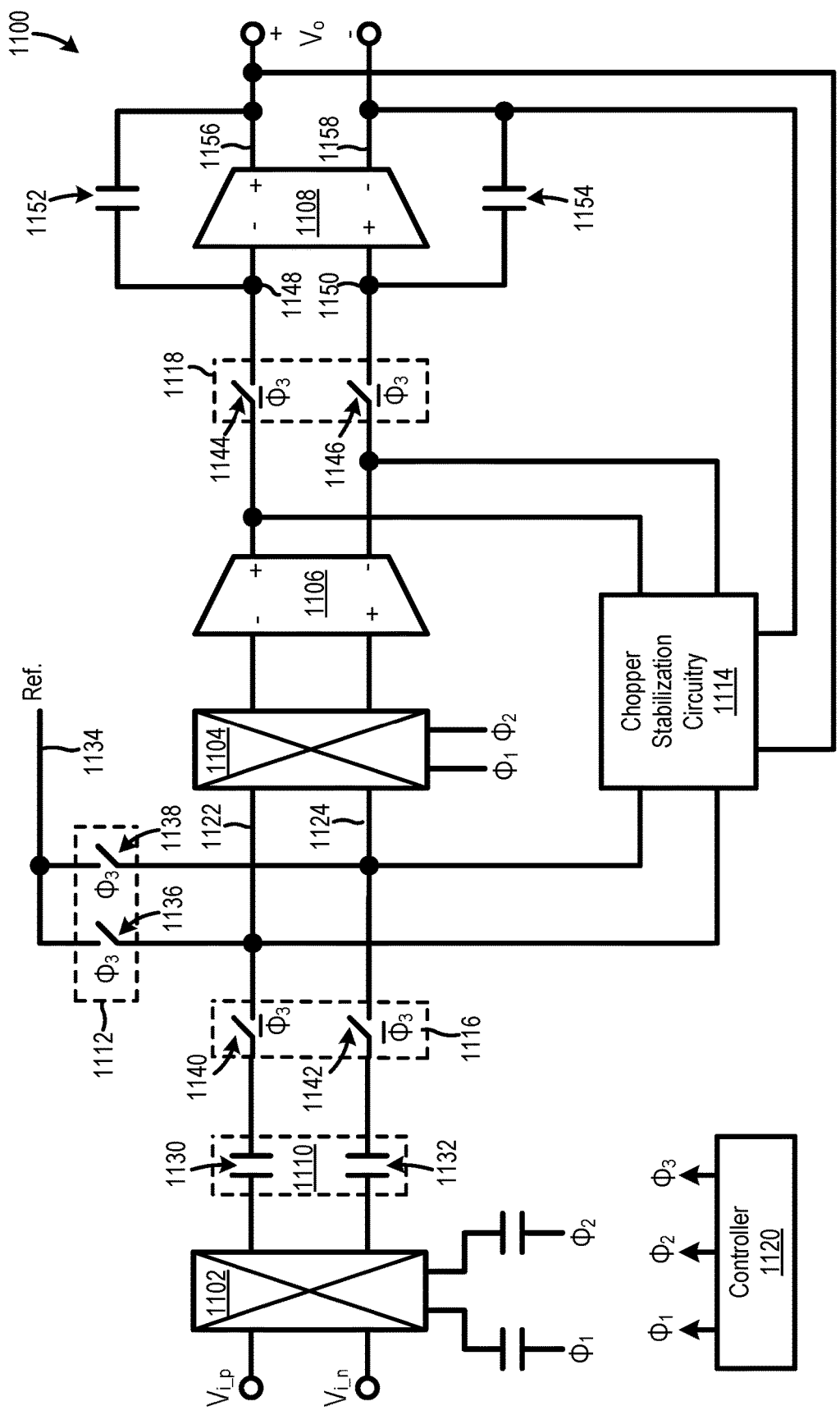
FIG. 11 illustrates a chopper-stabilized instrumentation amplifier configured to repeatedly clamp common-mode voltage to a reference voltage, according to an embodiment.

FIG. 11 illustrates a chopper-stabilized instrumentation amplifier 1100 including a first chopper 1102, a second chopper 1104, a first gain stage 1106, a second gain stage 1108, a capacitive isolation stage 1110, clamping circuitry 1112, chopper stabilization circuitry 1114, first switching circuitry 1116, second switching circuitry 1118, and a controller 1120. First chopper 1102 is electrically coupled between (a) amplifier inputs $V_{i\_p}$ and $V_{i\_n}$ and (b) capacitive isolation stage 1110. First chopper 1102 is controlled by clock signals $\phi_1$ and $\phi_2$ and includes at least a first operating state and a second operating state analogous to the first and second operating states of first chopper 302 of FIG. 3. First chopper 1102 operates in its first operating state when clock signal $\phi_1$ is asserted, and first chopper 1102 operates in its second operating state when clock signal $\phi_2$ is asserted. In some embodiments, first chopper 1102 includes a plurality of transistors (not shown) controlled by clock signals $\phi_1$ and $\phi_2$ to realize the first and second operating states.

Capacitive isolation stage 1110 is electrically coupled between first chopper 1102 and inputs 1122 and 1124 of second chopper 1104. Capacitive isolation stage 1110 electrically couples alternating current (AC) signals between first chopper 1102 and second chopper 1104 while blocking transmission of DC signals. In some embodiments, capacitive isolation stage 1110 includes a first capacitor 1130 and a second capacitor 1132, as illustrated. In these embodiments, first capacitor 1130 is electrically coupled in series with second chopper input 1122, and second capacitor 1132 is electrically coupled in series with second chopper input 1124. Capacitive isolation stage 1110 could include additional capacitors without departing from the scope hereof. Additionally, capacitive isolation stage 1110 could be replaced with another device transmitting only AC signals, such as an optocoupler.

Clamping circuitry 1112 is electrically coupled between second chopper inputs 1122 and 1124 and a reference voltage rail 1134. In certain embodiments, reference voltage rail 1134 has a fixed electrical potential that is set to achieve a desired common-mode voltage at second chopper inputs 1122 and 1124. Clamping circuit 1112 is configured to clamp second chopper inputs 1122 and 1124 to reference voltage rail 1134 when clock signal $\phi_3$ is asserted. Clamping circuitry 1112 repeatedly clamps second chopper inputs 1122 and 1124 to reference voltage rail 1134, thereby repeatedly resetting common-mode voltage in instrumentation amplifier 1100, to help minimize common-mode voltage settling time after a transient event. In certain embodiments, clamping circuitry 1112 includes switching devices 1136 and 1138 electrically coupled between reference voltage rail 1134 and second chopper inputs 1122 and 1124, respectively, as illustrated. Switching devices 1136 and 1138 are closed when clock signal $\phi_3$ is asserted, to respectively clamp second chopper inputs 1122 and 1124 to reference voltage rail 1134. Switching devices 1136 and 1138 are open when clock signal $\phi_3$ is de-asserted. Each of switching devices 1136 and 1138 includes one or more transistors, for example. The configuration of clamping circuitry 1112 could be varied, such as to include additional switching devices, without departing from the scope hereof.

First switching circuitry 1116 is configured to electrically isolate second chopper inputs 1122 and 1124 from CCIA inputs $V_{i\_p}$ and $V_{i\_n}$, when clamping circuitry 1112 clamps second chopper inputs 1122 and 1124 to reference voltage rail 1134, i.e., when clock signal $\phi_3$ is asserted. In certain embodiments, first switching circuitry 1116 includes a respective switching device 1140 and 1142 electrically coupled in series with second chopper inputs 1122 and 1124, as illustrated. Switching devices 1140 and 1142 are closed when clock signal $\phi_3$ is de-asserted, and switching devices 1140 and 1142 are open when clock signal $\phi_3$ is asserted. Each of switching devices 1140 and 1142 includes one or more transistors, for example. Although first switching circuitry 1116 is illustrated as being electrically coupled between capacitive isolation stage 1110 and second chopper 1104, first switching circuitry 1116 could alternately be electrically coupled between first chopper 1102 and capacitive isolation stage 1110.

Second chopper 1104 is electrically coupled between capacitive isolation stage 1110 and first gain stage 1106. Second chopper 1104 is controlled by clock signals $\phi_1$ and $\phi_2$ in a manner like that of first chopper 1102. In particular, second chopper 1104 operates in its first operating state when clock signal $\phi_1$ is asserted, and second chopper 1104 operates in its second operating state when clock signal $\phi_2$ is asserted. In some embodiments, second chopper 1104 includes a plurality of transistors (not shown) controlled by clock signals $\phi_1$ and $\phi_2$ to realize the first and second operating states.

First gain stage 1106 is communicatively coupled to capacitive isolation stage 1110 via second chopper 1140. In particular embodiments, first gain stage 1106 performs a transconductance function, i.e., it generates differential output current signals in response to a difference in input voltage signals. However, the configuration of first gain stage 1106 could vary without departing from the scope hereof. Although first gain stage 1106 is illustrated as a single element for illustrative simplicity, first gain stage 1106 may include a plurality of elements.

Second switching circuitry 1118 is configured to electrically isolate second gain stage 1108 from first gain stage 1106 when clamping circuitry 1112 clamps second chopper inputs 1122 and 1124 to reference voltage rail 1134, i.e., when clock signal $\phi_3$ is asserted. In certain embodiments, second switching circuitry 1118 includes a respective switching device 1144 and 1146 electrically coupled in series with inputs 1148 and 1150 of second gain stage 1108, as illustrated. Switching devices 1144 and 1146 are closed when clock signal $\phi_3$ is de-asserted, and switching devices 1144 and 1146 are open when clock signal $\phi_3$ is asserted. Each of switching devices 1144 and 1146 includes one or more transistors, for example.

In particular embodiments, second gain stage 1108 performs a transconductance function, and amplifier 1100 further includes feedback capacitors 1152 and 1154, as illustrated. Feedback capacitor 1152 is electrically coupled between second gain stage input 1148 and an output 1156 of second gain stage 1108. Feedback capacitor 1154 is electrically coupled between second gain stage input 1150 and an output 1158 of second gain stage 1108. Accordingly, second gain stage 1108 is miller-compensated. The configuration of second gain stage 1108 could vary, though, without departing from the scope hereof. Although second gain stage 1108 is illustrated as a single element for illustrative simplicity, second gain stage 1108 may include a plurality of elements without departing from the scope hereof.

Figure 12:
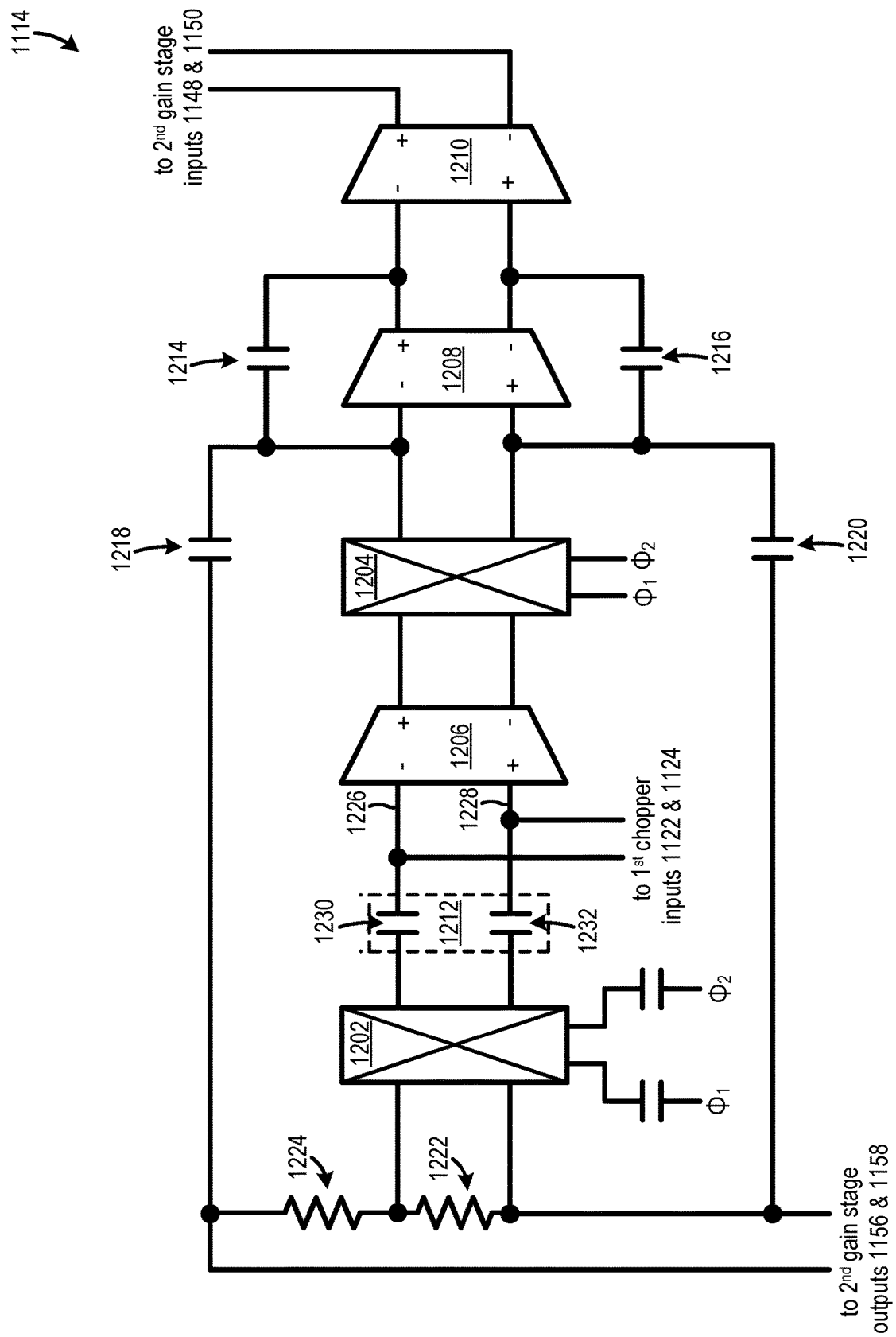
FIG. 12 illustrates chopper stabilization circuitry of the FIG. 11 instrumentation amplifier.

FIG. 12 illustrates chopper stabilization circuitry 1114 including a third chopper 1202, a fourth chopper 1204, a third gain stage 1206, a fourth gain stage 1208, a fifth gain stage 1210, feedback capacitors 1214 and 1216, feedback capacitors 1218 and 1220, and resistors 1222 and 1224. Resistors 1222 and 1224 collectively form a voltage divider across outputs of second gain stage 1108, and third chopper 1202 is electrically coupled between resistor 1222 and second capacitive isolation stage 1212. Third chopper 1202 is controlled by clock signals $\phi_1$ and $\phi_2$ in a manner like that of first chopper 1102. In particular, third chopper 1202 operates in its first operating state when clock signal $\phi_1$ is asserted, and third chopper 1202 operates in its second operating state when clock signal $\phi_2$ is asserted. In some embodiments, third chopper 1202 includes a plurality of transistors (not shown) controlled by clock signals $\phi_1$ and $\phi_2$ to realize the first and second operating states.

Second capacitive isolation stage 1212 is electrically coupled between third chopper 1202 and inputs 1226 and 1228 of third gain stage 1206. Capacitive isolation stage 1212 electrically couples alternating current (AC) signals between third chopper 1202 and third gain stage 1206 while blocking transmission of DC signals. In some embodiments, capacitive isolation stage 1212 includes a third capacitor 1230 and a fourth capacitor 1232, as illustrated. In these embodiments, third capacitor 1230 is electrically coupled in series with third gain stage input 1226, and fourth capacitor 1232 is electrically coupled in series with third gain stage input 1228. Capacitive isolation stage 1212 could include additional capacitors without departing from the scope hereof. Additionally, capacitive isolation stage 1212 could be replaced with another device transmitting only AC signals, such as an optocoupler.

Third gain stage 1206 is communicatively coupled between second capacitive isolation stage 1212 and fourth chopper 1204. In particular embodiments, third gain stage 1206 performs a transconductance function, i.e., it generates differential output current signals in response to a difference in input voltage signals. However, the configuration of third gain stage 1206 could vary without departing from the scope hereof. Although third gain stage 1206 is illustrated as a single element for illustrative simplicity, third gain stage 1206 may include a plurality of elements.

Fourth chopper 1204 is electrically coupled between third gain stage 1206 and fourth gain stage 1208. Fourth chopper 1204 is controlled by clock signals $\phi_1$ and $\phi_2$ in a manner like that of first chopper 1102. In particular, fourth chopper 1204 operates in its first operating state when clock signal $\phi_1$ is asserted, and fourth chopper 1204 operates in its second operating state when clock signal $\phi_2$ is asserted. In some embodiments, fourth chopper 1204 includes a plurality of transistors (not shown) controlled by clock signals $\phi_1$ and $\phi_2$ to realize the first and second operating states.

Fourth gain stage 1208 is electrically coupled between fourth chopper 1204 and fifth gain stage 1210. In particular embodiments, fourth gain stage 1208 performs a transconductance function. Feedback capacitors 1214 and 1216 are electrically coupled between respective inputs and outputs of fourth gain stage 1208. The configuration of fourth gain stage 1208 could vary without departing from the scope hereof. Although fourth gain stage 1208 is illustrated as a single element for illustrative simplicity, fourth gain stage 1208 may include a plurality of elements without departing from the scope hereof. Feedback capacitors 1218 and 1220 are electrically coupled between respective outputs of second gain stage 1108 and respective inputs of fourth gain stage 1208.

Fifth gain stage 1210 is electrically coupled between fourth gain stage 1208 and second gain stage inputs 1148 and 1150. In particular embodiments, fifth gain stage 1210 performs a transconductance function, but the configuration of fifth gain stage 1210 could vary without departing from the scope hereof. Although fifth gain stage 1210 is illustrated as a single element for illustrative simplicity, fifth gain stage 1210 may include a plurality of elements without departing from the scope hereof.

Controller 1120 (FIG. 11) generates first clock signal $\phi_1$, second clock signal $\phi_2$, and third clock signal $\phi_3$. Controller 1120 is formed, for example, of analog electrical circuitry, digital electrical circuitry, or a combination of analog and digital electrical circuitry. Although controller 1120 is symbolically illustrated as a single element, controller 1120 could be formed of multiple elements, such as multiple integrated circuits and/or multiple discrete components.

In certain embodiments, controller 1120 generates first clock signal $\phi_1$ and second clock signal $\phi_2$ such that first clock signal $\phi_1$ and second clock signal $\phi_2$ are asserted in a complementary manner, i.e., first clock signal $\phi_1$ is asserted when second clock signal $\phi_2$ is de-asserted, and vice versa. Consequently, first, second, third, and fourth choppers 1102, 1104, 1202, and 1204 repeatedly switch between their respective first and second operating states in unison, in these embodiments. First gain stage 1106 forms part of a high-frequency, low-gain first path, and third gain stage 1206 forms part of a low-offset, low-frequency, and low-gain second path. Chopper stabilization circuitry 1114 corrects input offset voltage of first gain stage 1106 to the extent that the second path has a higher gain than the first path.

Controller 1120 asserts third clock signal $\phi_3$ at least once during each time that first clock signal $\phi_1$ is asserted, and controller 1120 also asserts third clock signal $\phi_3$ at least once during each time that second clock signal $\phi_2$ is asserted, such that third clock signal $\phi_3$ is asserted at least once during each chopper cycle. Consequently, clamping circuitry 1112 clamps second chopper inputs 1122 and 1124 to reference voltage rail 1134 at least once during each time that first, second, third, and fourth choppers 1102, 1104, 1202, and 1204 operate in their respective first operating states, and clamping circuitry 1112 clamps second chopper inputs 1122 and 1124 to reference voltage rail 1134 at least once during each time that first, second, third, and fourth choppers 1102, 1104, 1202, and 1204 operate in their respective second operating states. Consequently, clamping circuitry 1112 repeatedly clamps common-mode voltage at second chopper inputs 1122 and 1124 to a reference voltage of reference voltage rail 1134, thereby repeatedly "resetting" the common-mode voltage. As a result, amplifier 1100 is advantageously significantly less prone to glitches from common-mode transient events than conventional amplifiers without clamping circuitry 1112.

Figure 13:
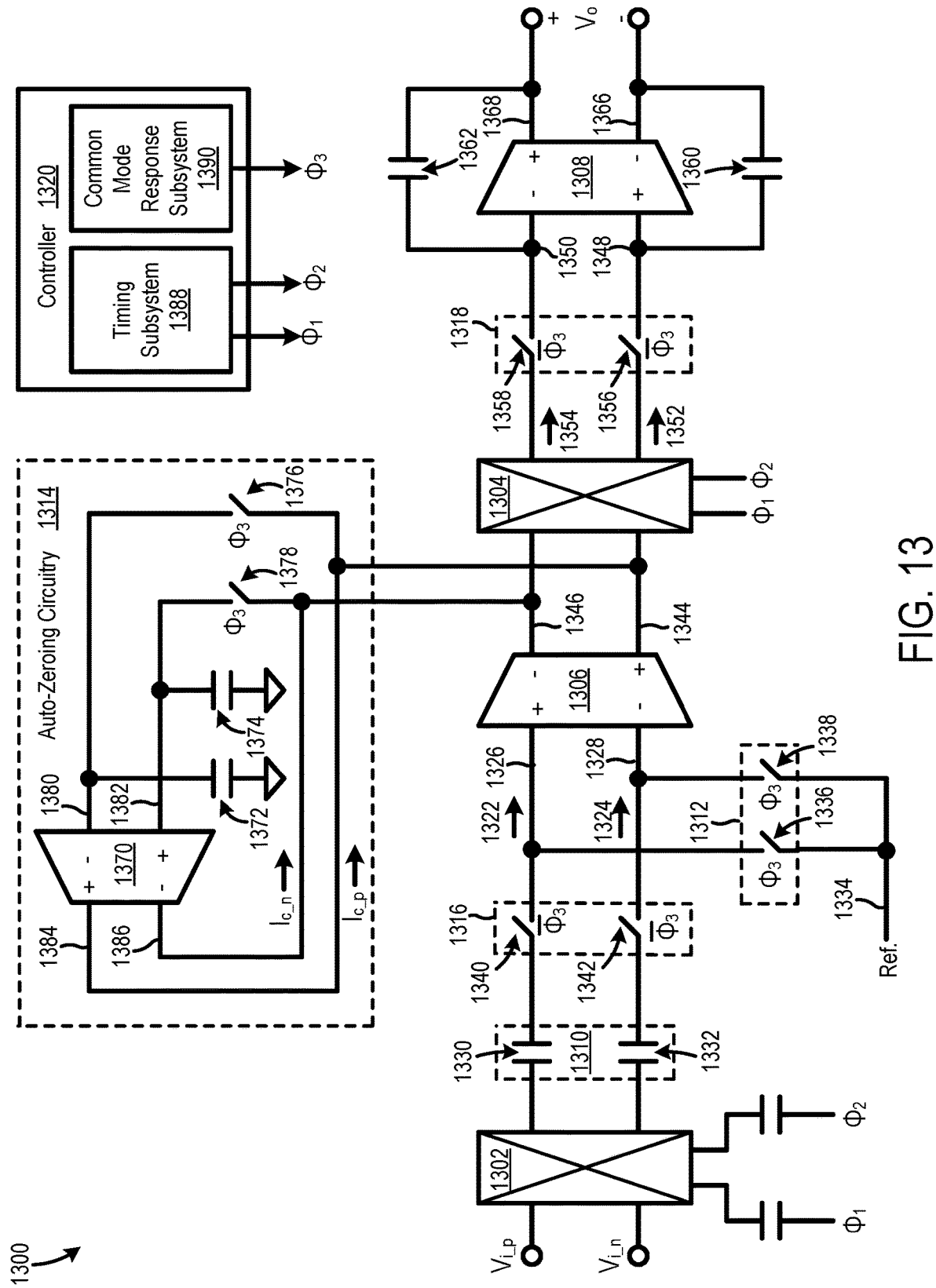
FIG. 13 illustrates a CCIA configured to (a) isolate a gain stage from amplifier inputs and (b) clamp common-mode voltage at a capacitively-isolated portion of the CCIA to a reference voltage, in response to a change in common-mode voltage, according to an embodiment.

FIG. 13 illustrates a CCIA 1300, which is one embodiment of the new CCIAs configured to (a) isolate a gain stage from amplifier inputs and (b) clamp common-mode voltage at a capacitively isolated portion of the CCIA to a reference voltage, in response to a detected change in common-mode voltage. CCIA 1300 includes a first chopper 1302, a second chopper 1304, a first gain stage 1306, a second gain stage 1308, a capacitive isolation stage 1310, clamping circuitry 1312, auto-zeroing circuitry 1314, first switching circuitry 1316, second switching circuitry 1318, and a controller 1320.

First chopper 1302 is electrically coupled between (a) CCIA inputs $V_{i\_p}$ and $V_{i\_n}$ and (b) capacitive isolation stage 1310. First chopper 1302 is controlled by clock signals $\phi_1$ and $\phi_2$ and includes at least a first operating state and a second operating state. First chopper 1302 operates in its first operating state when clock signal $\phi_1$ is asserted, and first chopper 1302 operates in its second operating state when clock signal $\phi_2$ is asserted. The first operating state is characterized by straight signal transmission, i.e., first chopper 1302 electrically couples CCIA input $V_{i\_p}$ to a positive input path 1322, and first chopper 1302 electrically couples CCIA input $V_{i\_n}$ to a negative input path 1324. The second operating state is characterized by reverse signal transmission, i.e., first chopper 1302 electrically couples CCIA input $V_{i\_p}$ to negative input path 1324, and first chopper 1302 electrically couples CCIA input $V_{i\_n}$ to positive input path 1322. Positive input path 1322 feeds into an input 1326 of first gain stage 1306, and negative input path 1324 feeds into an input 1328 of first gain stage 1306. In some embodiments, first chopper 1302 includes a plurality of transistors (not shown) controlled by clock signals $\phi_1$ and $\phi_2$ to realize the first and second operating states.

Capacitive isolation stage 1310 is electrically coupled between first chopper 1302 and first gain stage inputs 1326 and 1328, such that first gain stage 1306 is communicatively coupled with capacitive isolation stage 1310. Capacitive isolation stage 1310 electrically couples alternating current (AC) signals between first chopper 1302 and first gain stage 1306 while blocking transmission of DC signals. In some embodiments, capacitive isolation stage 1310 includes a first capacitor 1330 and a second capacitor 1332, as illustrated. In these embodiments, first capacitor 1330 is electrically coupled in series with positive input path 1322, and second capacitor 1332 is electrically coupled in series with negative input path 1324. Capacitive isolation stage 1310 could include additional capacitors without departing from the scope hereof. Additionally, capacitive isolation stage 1310 could be replaced with another device transmitting only AC signals, such as an optocoupler.

Clamping circuitry 1312 is electrically coupled between first gain stage inputs 1326 and 1328 and a reference voltage rail 1334. In certain embodiments, reference voltage rail 1334 has a fixed electrical potential that is set to achieve a desired common-mode voltage at first gain stage inputs 1326 and 1328. Clamping circuit 1312 is configured to clamp first gain stage inputs 1326 and 1328 to reference voltage rail 1334 when clock signal $\phi_3$ is asserted, thereby clamping common-mode voltage at first gain stage inputs 1326 and 1328 to a reference voltage of reference voltage rail 1334. As discussed below, clock signal $\phi_3$ is asserted in response to a change in common-mode voltage at CCIA inputs $V_{i\_p}$ and $V_{i\_n}$, to help minimize common-mode voltage settling time after a transient event. In certain embodiments, clamping circuitry 1312 includes switching devices 1336 and 1338 electrically coupled between reference voltage rail 1334 and first gain stage inputs 1326 and 1328, respectively, as illustrated. Switching devices 1336 and 1338 are closed when clock signal $\phi_3$ is asserted, to respectively clamp first gain stage inputs 1326 and 1328 to reference voltage rail 1334. Switching devices 1336 and 1338 are open when clock signal $\phi_3$ is de-asserted. Each of switching devices 1336 and 1338 includes one or more transistors, for example. The configuration of clamping circuitry 1312 could be varied, such as to include additional switching devices, without departing from the scope hereof.

First switching circuitry 1316 is configured to electrically isolate first gain stage inputs 1326 and 1328 from CCIA inputs $V_{i\_p}$ and $V_{i\_n}$, when clamping circuitry 1312 clamps first gain stage inputs 1326 and 1328 to reference voltage rail 1334, i.e., when clock signal $\phi_3$ is asserted. In certain embodiments, first switching circuitry 1316 includes a respective switching device 1340 and 1342 electrically coupled in series with positive input path 1322 and negative input path 1324, as illustrated. Switching devices 1340 and 1342 are closed when clock signal $\phi_3$ is de-asserted, and switching devices 1340 and 1342 are open when clock signal $\phi_3$ is asserted. Each of switching devices 1340 and 1342 includes one or more transistors, for example. Although first switching circuitry 1316 is illustrated as being electrically coupled between capacitive isolation stage 1310 and first gain stage 1306, first switching circuitry 1316 could alternately be electrically coupled between first chopper 1302 and capacitive isolation stage 1310.

First gain stage 1306 is communicatively coupled to capacitive isolation stage 1310 via first switching circuitry 1316. In particular embodiments, first gain stage 1306 performs a transconductance function, i.e., it generates differential output current signals in response to a difference in input voltage signals. However, the configuration of first gain stage 1306 could vary without departing from the scope hereof. Although first gain stage 1306 is illustrated as a single element for illustrative simplicity, first gain stage 1306 may include a plurality of components.

Second chopper 1304 is electrically coupled between outputs 1344 and 1346 of first gain stage 1306 and inputs 1348 and 1350 of second gain stage 1308. Second chopper 1304 is controlled by clock signals $\phi_1$ and $\phi_2$ in a manner like that of first chopper 1302. In particular, second chopper 1304 operates in its first operating state when clock signal $\phi_1$ is asserted, and second chopper 1304 operates in its second operating state when clock signal $\phi_2$ is asserted. The first operating state is characterized by straight signal transmission, i.e., second chopper 1304 electrically couples first gain stage output 1344 to a positive output path 1352, and second chopper 1304 electrically couples first gain stage output 1346 to a negative output path 1354. The second operating state is characterized by reverse signal transmission, i.e., second chopper 1304 electrically couples first gain stage output 1344 to negative output path 1354, and second chopper 1304 electrically couples first gain stage output 1346 to positive output path 1352. Positive output path 1352 feeds into second gain stage input 1348, and negative output path 1354 feeds into second gain stage input 1350. In some embodiments, second chopper 1304 includes a plurality of transistors (not shown) controlled by clock signals $\phi_1$ and $\phi_2$ to realize the first and second operating states.

Second switching circuitry 1318 is configured to electrically isolate second gain stage inputs 1348 and 1350 from first gain stage outputs 1344 and 1346 when clamping circuitry 1312 clamps first gain stage inputs 1326 and 1328 to reference voltage rail 1334, i.e., when clock signal $\phi_3$ is asserted. In certain embodiments, second switching circuitry 1318 includes a respective switching device 1356 and 1358 electrically coupled in series with positive output path 1352 and with negative output path 1354, as illustrated. Switching devices 1356 and 1358 are closed when clock signal $\phi_3$ is de-asserted, and switching devices 1356 and 1358 are open when clock signal $\phi_3$ is asserted. Each of switching devices 1356 and 1358 includes one or more transistors, for example. Although second switching circuitry 1318 is illustrated as being electrically coupled between second chopper 1304 and second gain stage 1308, second switching circuitry 1318 could alternately be electrically coupled between first gain stage 1306 and second chopper 1304.

In particular embodiments, second gain stage 1308 performs a transconductance function, and CCIA 1300 further includes feedback capacitors 1360 and 1362, as illustrated. Feedback capacitor 1360 is electrically coupled between second gain stage input 1348 and an output 1366 of second gain stage 1308. Feedback capacitor 1362 is electrically coupled between second gain stage input 1350 and an output 1368 of second gain stage 1308. Accordingly, second gain stage 1308 is miller-compensated. The configuration of second gain stage 1308 could vary, though, without departing from the scope hereof. Although second gain stage 1308 is illustrated as a single element for illustrative simplicity, second gain stage 1308 may include a plurality of components without departing from the scope hereof.

Auto-zeroing circuitry 1314 is electrically coupled to first gain stage outputs 1344 and 1346. Auto-zeroing circuitry 1314 includes a third gain stage 1370, auto-zeroing capacitors 1372 and 1374, and auto-zeroing switching devices 1376 and 1378. Auto-zeroing capacitors 1372 and 1374 are electrically coupled to first gain stage outputs 1344 and 1346 via auto-zeroing switching devices 1376 and 1378, respectively. Auto-zeroing capacitors 1372 and 1374 are also electrically coupled to third gain stage inputs 1380 and 1382, respectively. Outputs 1384 and 1386 of third gain stage 1370 are electrically coupled to first gain stage outputs 1344 and 1346, respectively. Auto-zeroing switching devices 1376 and 1378 are controlled by clock signal $\phi_3$, i.e., auto-zeroing switching devices 1376 and 1378 are closed when clock signal $\phi_3$ is asserted, and auto-zeroing switching devices 1376 and 1378 are open when clock signal $\phi_3$ is de-asserted.

Each of auto-zeroing switching devices 1376 and 1378 includes one or more transistors, for example. As discussed below, auto-zeroing circuitry 1314 injects current at first gain stage outputs 1344 and 1346 to compensate for output ripple induced by first and second choppers 1302 and 1304.

Controller 1320 includes a timing subsystem 1388 and a common-mode response subsystem 1390. Timing subsystem 1388 is configured to generate first clock signal $\phi_1$ and second clock signal $\phi_2$, and common-mode response subsystem 1390 is configured to generate third clock signal $\phi_3$, as discussed below. Controller 1320 is formed, for example, of analog electrical circuitry, digital electrical circuitry, or a combination of analog and digital electrical circuitry. For example, in one embodiment, controller 1320 is formed of a processor and interface circuitry, where the interface circuitry electrically couples the processor to the choppers and the switching devices of CCIA 1300. In this embodiment, the processor executes instructions in the form of software or firmware to generate first clock signal $\phi_1$, second clock signal $\phi_2$, and third clock signal $\phi_3$. Although controller 1320 is symbolically illustrated as a single element, controller 1320 could be formed of multiple elements, such as multiple integrated circuits and/or multiple discrete components. Additionally, while timing subsystem 1388 and common-mode response subsystem 1390 are illustrated as being separate elements, these two subsystems may share common components or even be part of a common subsystem.

In certain embodiments, timing subsystem 1388 generates first clock signal $\phi_1$ and second clock signal $\phi_2$ such that first clock signal $\phi_1$ and second clock signal $\phi_2$ are asserted in a complementary manner, i.e., first clock signal $\phi_1$ is asserted when second clock signal $\phi_2$ is de-asserted, and vice versa. Consequently, first and second choppers 1302 and 1304 repeatedly switch between their respective first and second operating states in unison, in these embodiments.

Common-mode response subsystem 1390 is configured to assert third clock signal $\phi_3$ in response to a change in common-mode voltage at CCIA inputs $V_{i\_p}$ and $V_{i\_n}$. In certain embodiments, common-mode response subsystem 1390 asserts third clock signal $\phi_3$ in response to rate of change in common-mode voltage at CCIA inputs $V_{i\_p}$ and $V_{i\_n}$ exceeding a predetermined threshold value, or in other words, in response to slew rate of common-mode voltage at CCIA inputs $V_{i\_p}$ and $V_{i\_n}$ exceeding a predetermined threshold value. In certain embodiments, common-mode response subsystem 1390 asserts third clock signal $\phi_3$ for at least as long as slew rate of common-mode voltage at CCIA inputs $V_{i\_p}$ and $V_{i\_n}$ exceeds the predetermined threshold value, while in some other embodiments, common-mode response subsystem 1390 asserts third clock signal $\phi_3$ for a predetermined time duration after detecting the slew rate of common-mode voltage exceeding the predetermined threshold value. The predetermined time duration is selected, for example, to be greater than an expected duration of common-mode voltage change under anticipated operating conditions. Alternatively or additionally, in some embodiments, common-mode response subsystem 1390 asserts third clock signal $\phi_3$ in response to change in magnitude of common-mode voltage at CCIA inputs $V_{i\_p}$ and $V_{i\_n}$ exceeding a predetermined threshold value.

Figure 14:
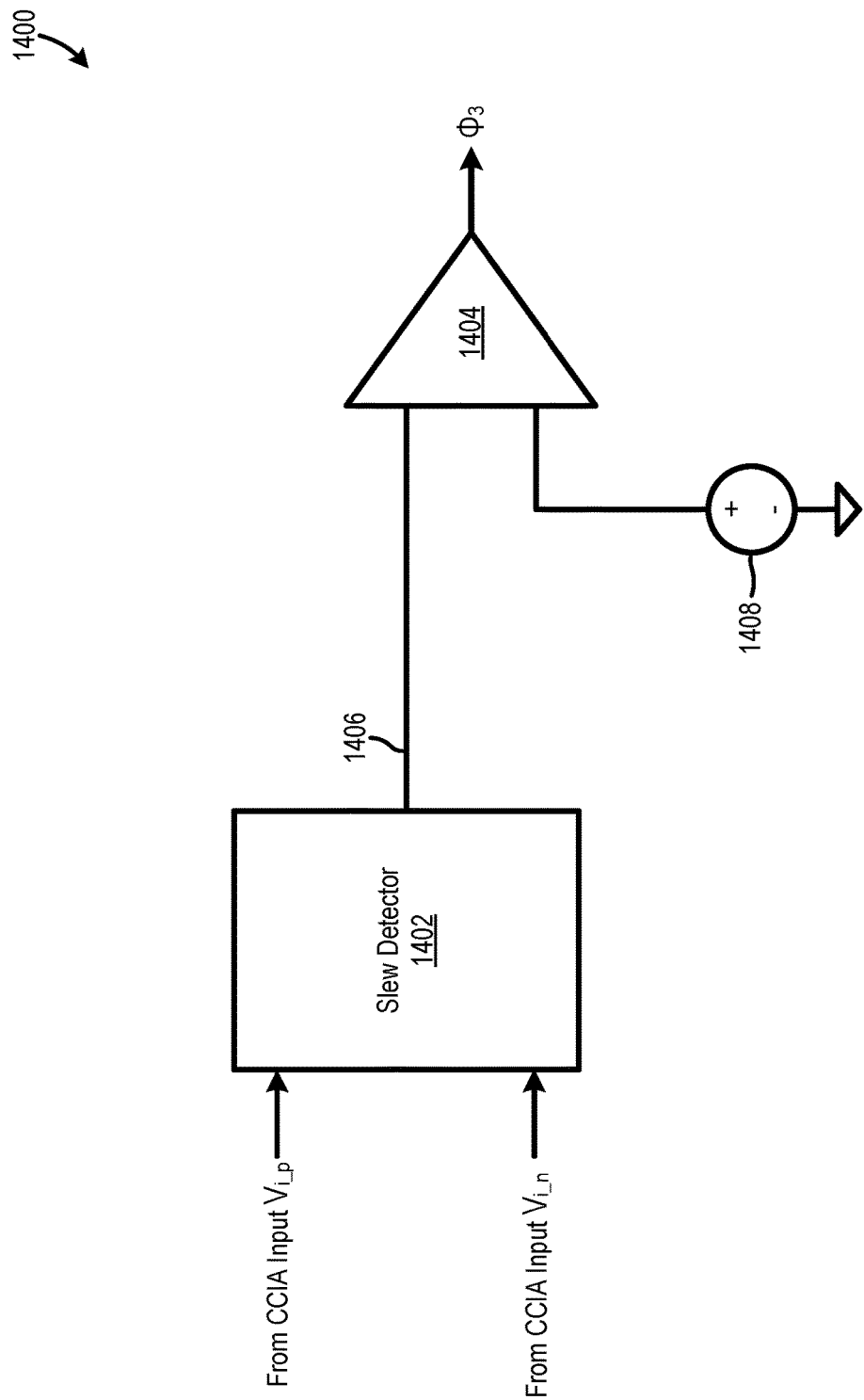
FIG. 14 illustrates a common-mode response subsystem, according to an embodiment.

FIG. 14 illustrates a common-mode response subsystem 1400, which is one possible embodiment of common-mode response subsystem 1390. Common-mode response subsystem 1400 includes slew detector 1402 and comparison circuitry 1404. Detector 1402 generates a slew signal 1406 representing rate of change of common-mode voltage at CCIA inputs $V_{i\_p}$ and $V_{i\_n}$. Comparison circuitry 1404 compares slew signal 1406 to a predetermined threshold value 1408, and comparison circuitry 1404 assert third clock signal $\phi_3$ in response to slew signal 1406 exceeding predetermined threshold value 1408. In some embodiments, comparison circuitry 1404 implements hysteresis to prevent third clock signal $\phi_3$ from oscillating between asserted and de-asserted states.

Figure 15:
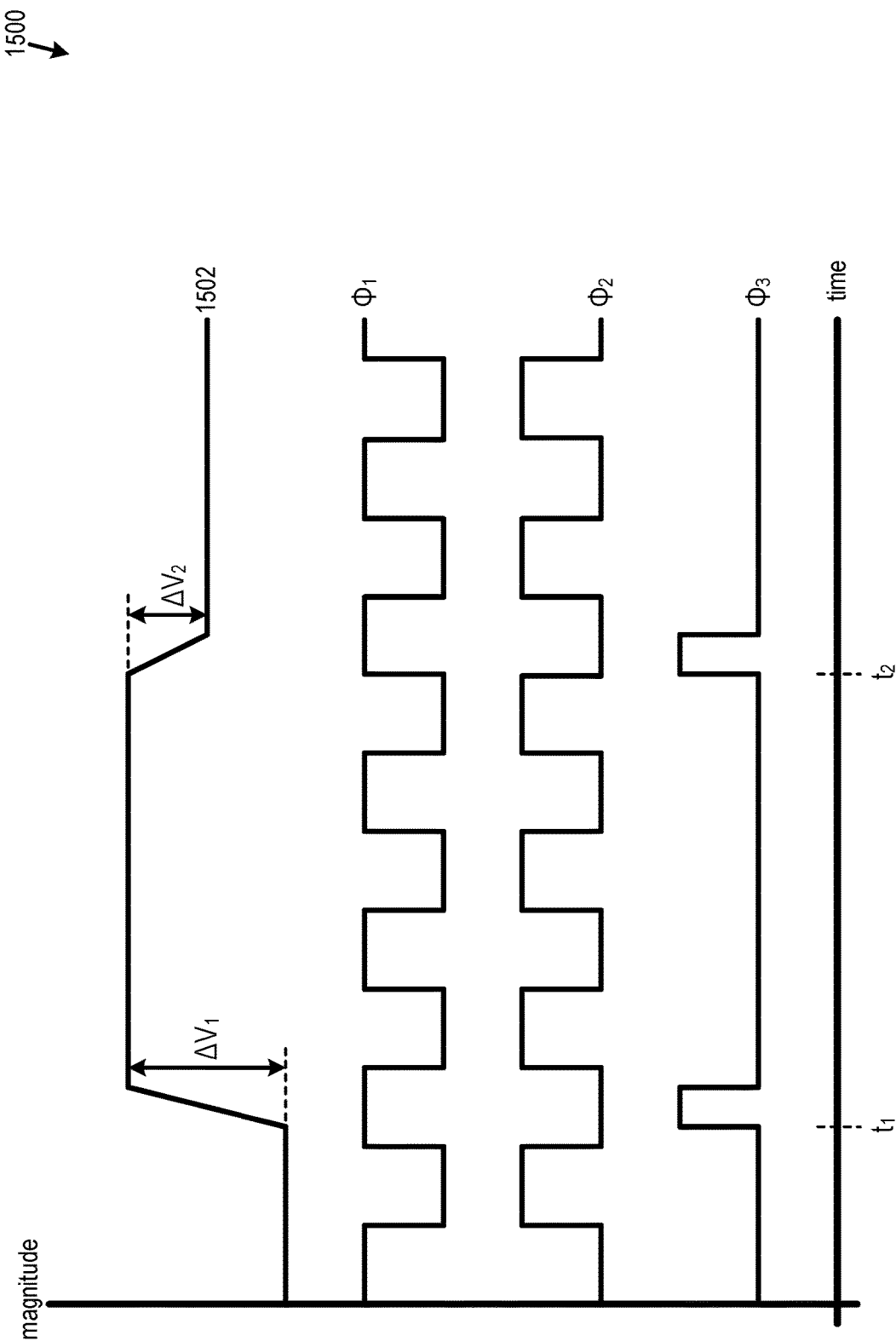
FIG. 15 is a graph illustrating one example of operation of an embodiment of the FIG. 13 CCIA in response to changes in common-mode voltage.

FIG. 15 is a graph 1500 illustrating one example of operation of an embodiment of CCIA 1300 in response to changes in common-mode voltage. FIG. 15 includes a curve 1502 representing common-mode voltage at CCIA inputs $V_{i\_p}$ and $V_{i\_n}$, as well as respective curves representing first, second, and third clock signals $\phi_1$, $\phi_2$, and $\phi_3$. The vertical axis of graph 1500 represents signal magnitude, and the horizontal axis of graph 1500 represents time. In this particular embodiment, the clock signals are asserted when they are logic high. However, CCIA 1300 could be configured such that one or more of first, second, and third clock signals $\phi_1$, $\phi_2$, and $\phi_3$ are asserted when they are logic low, without departing from the scope hereof.

In the FIG. 15 example, timing subsystem 1388 generates first and second clock signals $\phi_1$ and $\phi_2$ such that they are asserted in a complementary manner. Consequently, input offset voltage of first gain stage 1306 and noise at first gain stage inputs 1326 and 1328 are shifted to a high frequency. At time $t_1$, magnitude of common-mode voltage at CCIA inputs $V_{i\_p}$ and $V_{i\_n}$ change by $\Delta V_1$ at a high slew rate, and common-mode response subsystem 1390 detects this change in common-mode voltage and asserts third clock signal $\phi_3$ in response thereto. At time $t_2$, magnitude of common-mode voltage at CCIA inputs $V_{i\_p}$ and $V_{i\_n}$ changes by $\Delta V_2$ at high slew rate, and common-mode response subsystem 1390 detects this change in magnitude of common-mode voltage and asserts third clock signal $\phi_3$ in response thereto.

Accordingly, first switching circuitry 1316 isolates first gain stage 1306 from change in common-mode voltage at CCIA inputs $V_{i\_p}$ and $V_{i\_n}$ while third clock signal $\phi_3$ is asserted, thereby preventing change in common-mode voltage from reaching first gain stage 1306. As a result, first gain stage inputs 1326 and 1328 are significantly less prone to developing glitches from transient events than conventional CCIAs. Additionally, clamping circuitry 1312 clamps first gain stage inputs 1326 and 1328 to the reference voltage of reference voltage rail 1334 in response to change in common-mode voltage at CCIA inputs $V_{i\_p}$ and $V_{i\_n}$, thereby "resetting" the common-mode voltage to the reference voltage of reference voltage rail 1334. Consequently, CCIA 1300 is advantageously significantly less prone to glitches from common-mode transient events than conventional CCIAs.

Figure 16:
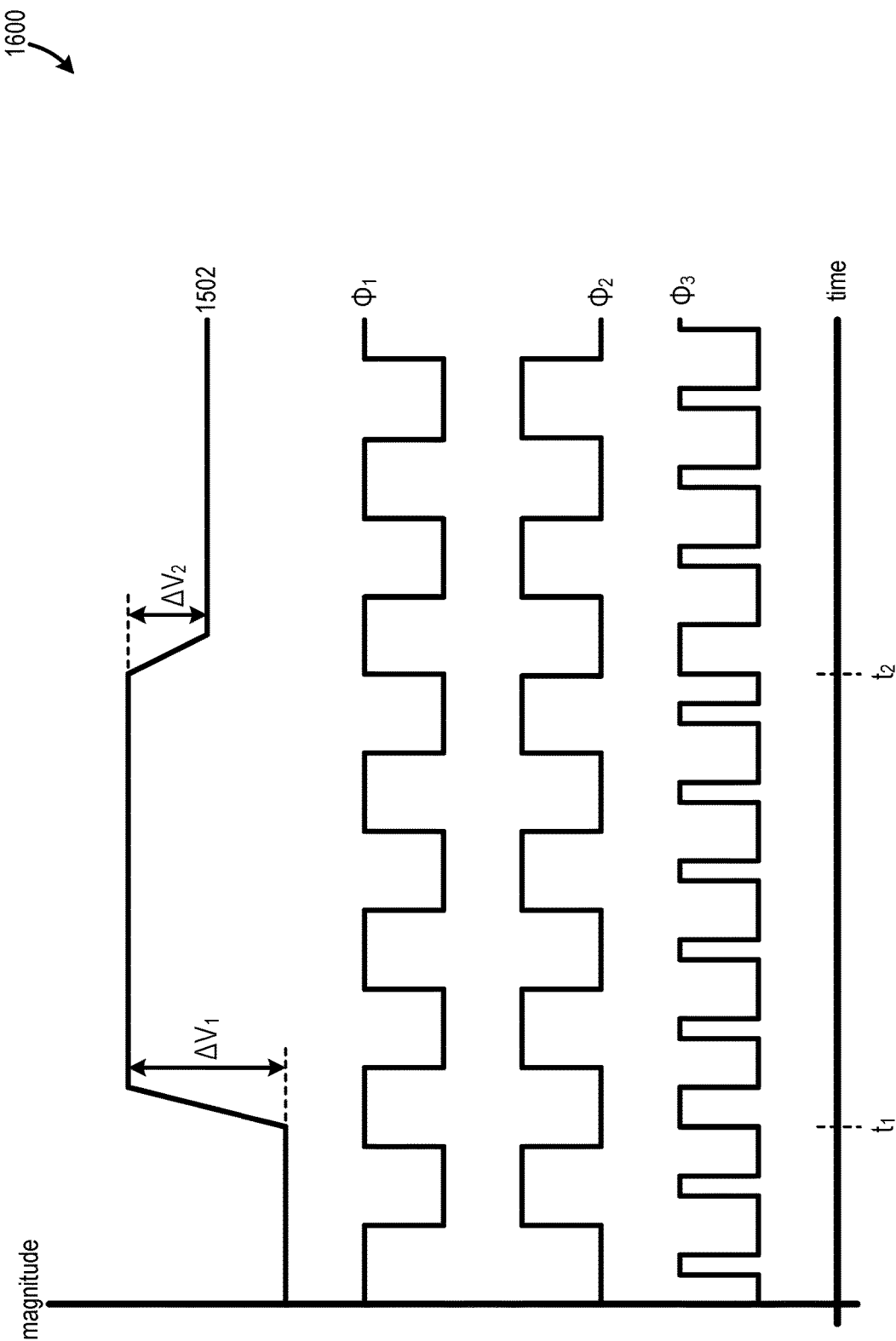
FIG. 16 is a graph illustrating another example of operation of an embodiment of the FIG. 13 CCIA.

Additionally, in some embodiments, common-mode response subsystem 1390 asserts third clock signal $\phi_3$ at least once during each chopper cycle, irrespective of change in common-mode voltage. For example, FIG. 16 is graph 1600 illustrating another example of operation of an embodiment of CCIA 1300. In this embodiment, common-mode response subsystem 1390 is configured to assert third clock signal $\phi_3$ at least once during each chopper cycle, as well as to assert third clock signal $\phi_3$ in response to a change in slew rate and/or magnitude of common-mode voltage at CCIA inputs $V_{i\_p}$ and $V_{i\_n}$ exceeding a predetermined threshold value. Such repeated assertion of third clock signal $\phi_3$ increases the AC common-mode rejection ratio (CMRR) of CCIA 1300.

Figure 17:
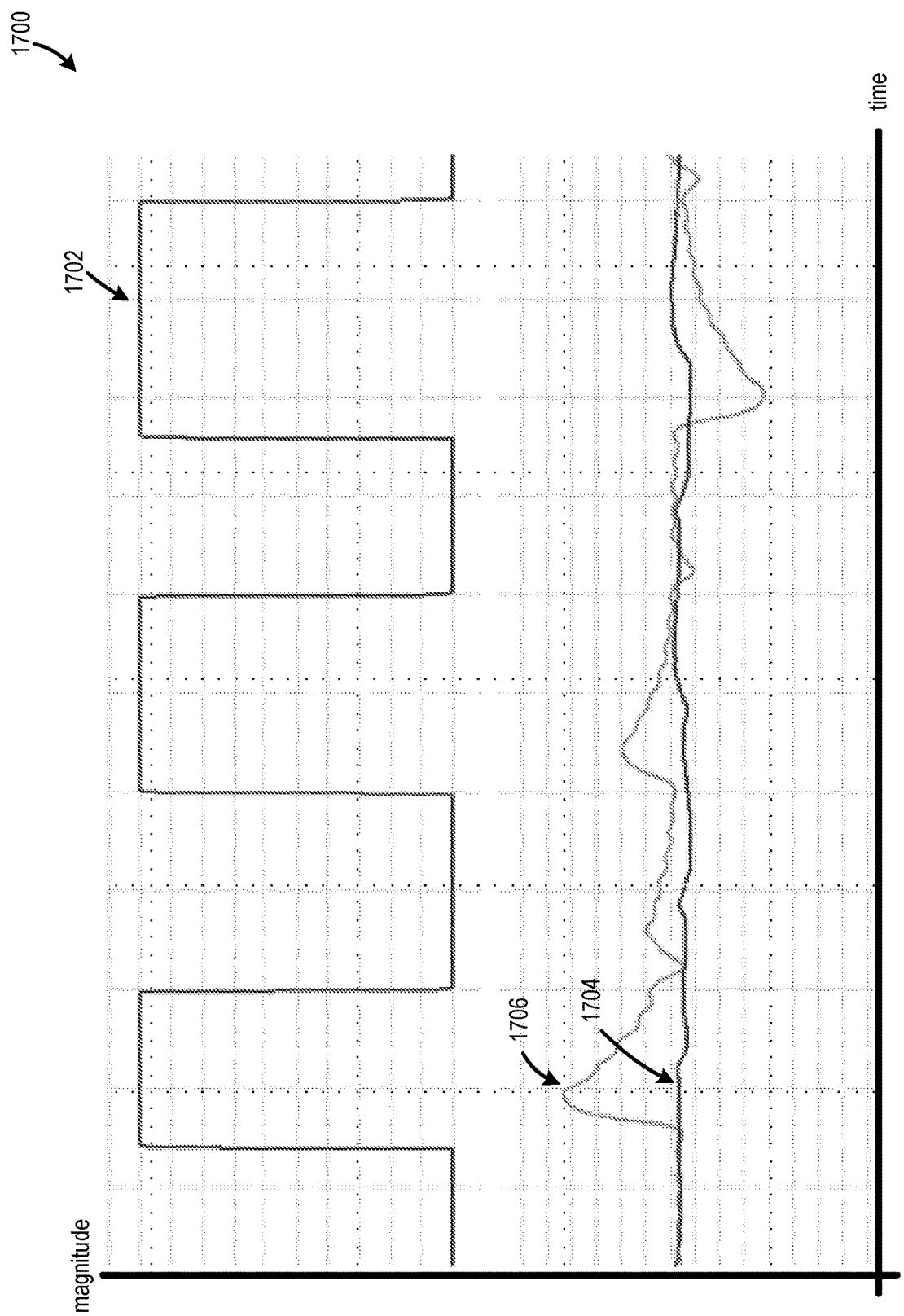
FIG. 17 is a graph of simulated output voltage of an embodiment of the FIG. 13 CCIA in response to a change in common-mode input voltage.

FIG. 17 is a graph 1700 of simulated output voltage of an embodiment of CCIA 1300 in response to a fifty volt change in common-mode input voltage. The vertical axis of graph 1700 represents voltage magnitude, and the horizontal axis of graph 1700 represents time. Curve 1702 represents common-mode voltage at CCIA inputs $V_{i\_p}$ and $V_{i\_n}$, and curve 1704 represents output voltage $V_{out}$ of CCIA 1300. Curve 1706, in turn, represents output voltage $V_{out}$ with clamping circuitry 1312 omitted from CCIA 1300. As evident from FIG. 17, inclusion of clamping circuitry 1312 in CCIA 1300 significantly reduces output voltage distortion in response to a common-mode input transient event.

Figure 18:
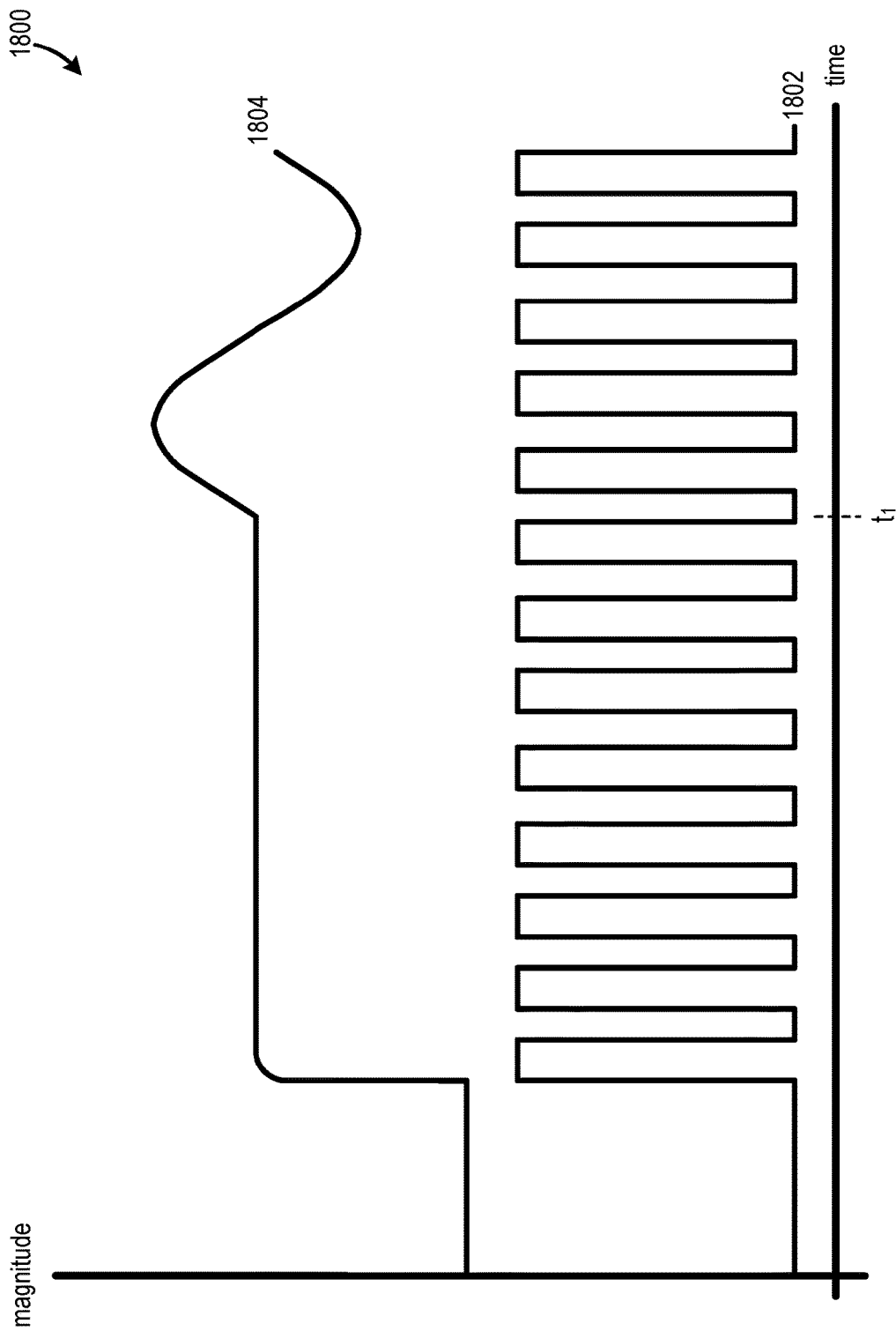
FIG. 18 is a graph of simulated output voltage of an embodiment of the FIG. 13 CCIA in response to a changing common-mode voltage and a differential AC voltage.

Additionally, Applicant has determined that asserting third clock signal $\phi_3$ in response to a change in common-mode voltage at CCIA inputs $V_{i\_p}$ and $V_{i\_n}$ does not prevent amplification of a differential AC signal at CCIA inputs $V_{i\_p}$ and $V_{i\_n}$. For example, FIG. 18 is a graph 1800 of simulated voltage of an embodiment of CCIA 1300 in response to (a) a repeated change in common-mode input voltage and (b) a differential AC voltage, at CCIA inputs $V_{i\_p}$ and $V_{i\_n}$. Curve 1802 represents common-mode voltage at CCIA inputs $V_{i\_p}$ and $V_{i\_n}$, and curve 1804 represents CCIA output voltage $V_{out}$. A relatively low-frequency AC differential signal (not shown) is also present at CCIA inputs $V_{i\_p}$ and $V_{i\_n}$ beginning at time $t_1$. As evident from curve 1804, CCIA 1300 rejects the common-mode signal, but CCIA 1300 amplifies the differential signal.

Furthermore, auto-zeroing circuitry 1314 leverages clamping circuitry 1312 to help minimize output ripple associated with operation of first and second choppers 1302 and 1304. In particular, clamping circuitry 1312 electrically shorts first gain stage inputs 1326 and 1328 together when third clock signal $\phi_3$ is asserted, and first gain stage outputs 1344 and 1346 therefore ideally have a common value when third clock signal $\phi_3$ is asserted. Auto-zeroing circuitry 1314 takes advantage of first gain stage inputs 1326 and 1328 being electrically shorted together by sampling first gain stage outputs 1344 and 1346 when third clock signal $\phi_3$ is asserted, i.e., when clamping circuiting 1312 clamps first gain stage inputs 1326 and 1328 to reference voltage rail 1334, to determine presence of ripple associated with operation of first and second choppers 1302 and 1304. Specifically, auto-zeroing switching devices 1376 and 1378 are closed when third clock signal $\phi_3$ is asserted, and auto-zeroing capacitors 1372 and 1374 are charged to respective voltages at first gain stage outputs 1344 and 1346. Third gain stage 1370 amplifies a difference in voltage between auto-zero capacitors 1372 and 1374 to generate compensation currents $I_{c\_p}$ and $I_{c\_n}$. Compensation currents $I_{c\_p}$ and $I_{c\_n}$ are injected at first gain stage outputs 1344 and 1346 to compensate for output ripple associated with operation of first and second choppers 1302 and 1304. Accordingly, the combination of auto-zero circuitry 1314 and clamping circuitry 1312 enables certain embodiments of CCIA 1300 to achieve lower output ripple than conventional CCIAs.

Figure 19:
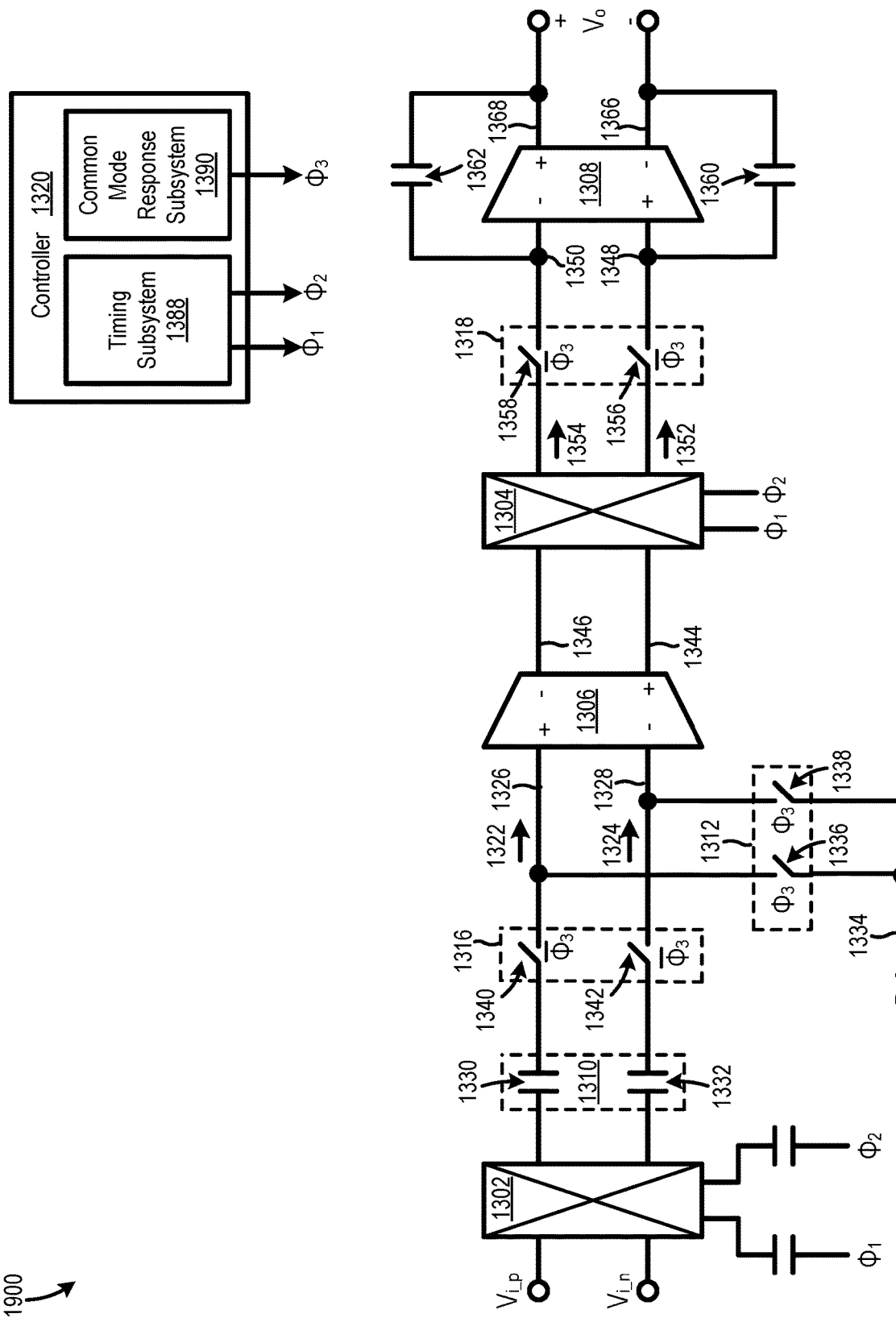
FIG. 19 illustrates a CCIA like that of FIG. 13 but with auto-zeroing circuitry omitted, according to an embodiment.

Auto-zeroing circuitry 1314 could be omitted from CCIA 1300 to reduce cost and complexity, with the drawback of increased output ripple. For example, FIG. 19 illustrates a CCIA 1900 which is like CCIA 1300 but with auto-zeroing circuitry 1314 omitted.

As discussed above, one possible application of the instrumentation amplifiers disclosed herein is in current sensing applications, such as for sensing current flowing through an inductive load, e.g. a motor or a solenoid, driven by a PWM voltage or a PFM voltage. Current sensing measurements in these applications often must be very accurate, such as to ensure proper control of the inductive load. Clamping circuitry 1312 in certain embodiments of CCIA 1300 causes CCIA 1300 to have a large CMRR, thereby enabling CCIA 1300 to substantially reject PWM and PFM common-mode voltage in current sensing applications. Consequently, certain embodiments of CCIA 1300 may enable accurate current sensing in applications where an inductive load is driven by a PWM or PFM voltage.

Figure 20:
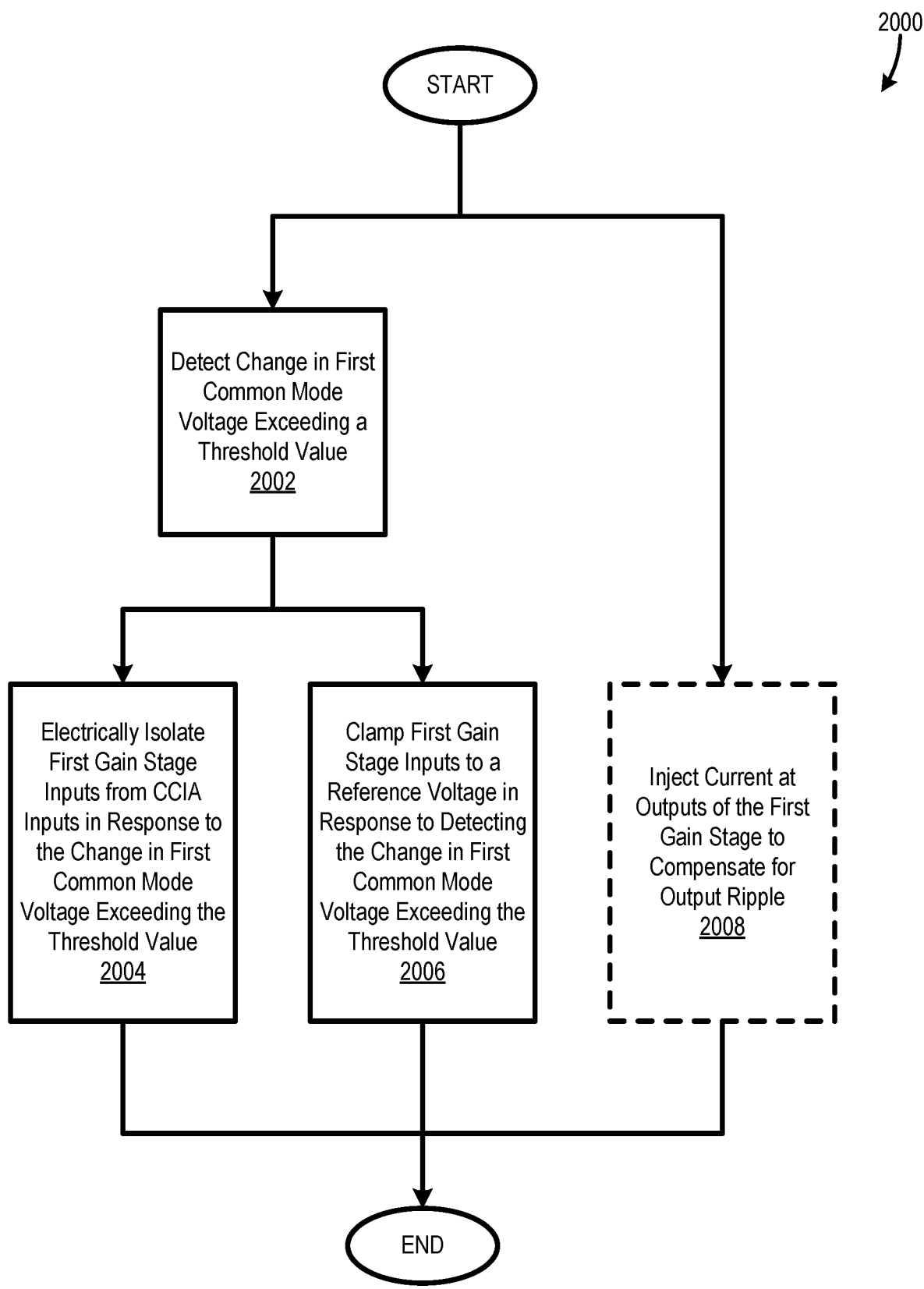
FIG. 20 illustrates a method for reducing common-mode settling time of a CCIA, according to an embodiment.

FIG. 20 illustrates a method 2000 for reducing common-mode settling time of a CCIA. In step 2002, a change in first common-mode voltage exceeding a threshold value is detected, where the first common-mode voltage is a common-mode voltage at inputs of the CCIA. In one example of step 2002, common-mode response subsystem 1390 detects a change in slew rate of common-mode voltage at CCIA inputs $V_{i\_p}$ and $V_{i\_n}$ exceeding a threshold value. In step 2004, the inputs of the first gain stage of the CCIA are electrically isolated from the CCIA inputs in response to detecting the change in the first common-mode voltage exceeding the threshold value. In one example of step 2004, first switching circuitry 1316 electrically isolates first gain stage inputs 1326 and 1328 from CCIA inputs $V_{i\_p}$ and $V_{i\_n}$ in response to slew rate of common-mode voltage at CCIA inputs $V_{i\_p}$ and $V_{i\_n}$ exceeding the threshold value. In step 2006, the inputs of the first gain stage of the CCIA are clamped to a reference voltage in response to detecting the change in the first common-mode voltage exceeding the threshold value. In one example of step 2006, clamping circuitry 1312 clamps first gain stage inputs 1326 and 1328 to the reference voltage of reference voltage rail 1334 in response to detecting the change in slew rate of common-mode voltage at CCIA inputs $V_{i\_p}$ and $V_{i\_n}$ exceeding the threshold value.

Method 2000 optionally further includes a step 2008 where current is injected at outputs of the first gain stage to compensate for output ripple induced by the first and second choppers. Step 2008 is, for example, executed in parallel with steps 2002, 2004, and 2006. In one example of step 2008, third gain stage 1370 injects compensation currents $I_{c\_p}$ and $I_{c\_n}$ at first gain stage outputs 1344 and 1346 to compensate for output ripple induced by first and second choppers 1302 and 1304. Outputs 1344 and 1346 of first gain stage 1306 are sampled when clamping first gain stage inputs 1326 and 1328 to reference voltage rail 1334, for example, to determine magnitude of compensation currents $I_{c\_p}$ and $I_{c\_n}$.

Applicant has further determined that the principles of detecting a change in common-mode voltage, and in response to the detected change, (a) isolating a gain stage from amplifier inputs, and (b) clamping common-mode voltage at a capacitively isolated portion of the CCIA to a reference voltage, are not limited to CCIAs. Instead, these principles can be applied to many other capacitive-coupled amplifiers. Discussed below with respect to FIGS. 21-24 are several examples of how the principles can be applied to amplifiers other than CCIAs. It should be appreciated, however, that the principles are not limited to the particular topologies discussed herein but can instead be applied to many other capacitively-coupled amplifiers.

Figure 21:
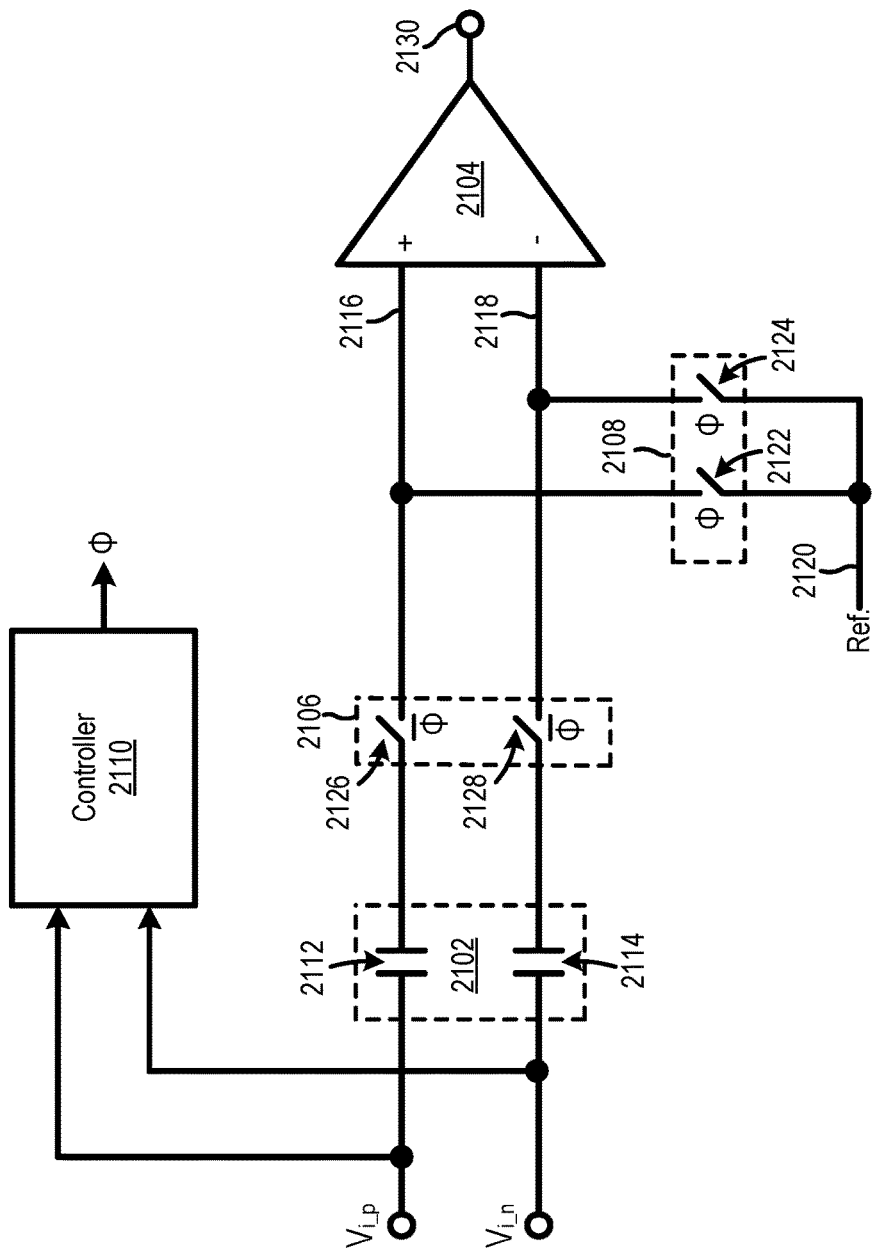
FIG. 21 illustrates a capacitive-coupled linear amplifier that is configured to (a) clamp common-mode voltage at a capacitively-isolated portion of the amplifier to a reference voltage and (b) isolate a gain stage from amplifier inputs, in response to a change in common-mode voltage, according to an embodiment.

For example, FIG. 21 illustrates a capacitive-coupled linear amplifier 2100 that is configured to detect a change in common-mode voltage at amplifier inputs, and in response to the detected change, (a) isolate a gain stage from amplifier inputs and (b) clamp common-mode voltage at a capacitively-isolated portion of amplifier to a reference voltage, thereby helping minimize common-mode voltage settling time after a transient event. Amplifier 2100 includes a capacitive isolation stage 2102, a gain stage 2104, switching circuitry 2106, clamping circuitry 2108, and a controller 2110.

Capacitive isolation stage 2102 includes a first capacitor 2112 and a second capacitor 2114. First capacitor 2112 is electrically coupled between an amplifier input $V_{i\_p}$ and an input 2116 of gain stage 2104, and second capacitor 2114 is electrically coupled between an amplifier input $V_{i\_n}$ and an input 2118 of gain stage 2104. Capacitive isolation stage 2102 electrically couples AC signals between amplifier inputs $V_{i\_p}$ and $V_{i\_n}$ and gain stage inputs 2116 and 2118 while blocking transmission of DC signals. Capacitive isolation stage 2102 could include additional capacitors without departing from the scope hereof. Additionally, capacitive isolation stage 2102 could be replaced with another device transmitting only AC signals, such as an optocoupler.

Clamping circuitry 2108 is electrically coupled between gain stage inputs 2116 and 2118 and a reference voltage rail 2120. In certain embodiments, reference voltage rail 2120 has a fixed electrical potential that is set to achieve a desired common-mode voltage at gain stage inputs 2116 and 2118. Clamping circuitry 2108 is configured to clamp gain stage inputs 2116 and 2118 to reference voltage rail 2120 when a clock signal $\phi$ is asserted. As discussed below, controller 2110 asserts clock signal $\phi$ in response to change in common-mode voltage at amplifier inputs $V_{i\_p}$ and $V_{i\_n}$, to help minimize common-mode voltage settling time after a transient event. In certain embodiments, clamping circuitry 2108 includes switching devices 2122 and 2124 electrically coupled between reference voltage rail 2120 and gain stage inputs 2116 and 2118, respectively, as illustrated. Switching devices 2122 and 2124 are closed when clock signal $\phi$ is asserted, to respectively clamp gain stage inputs 2116 and 2118 to reference voltage rail 2120. Switching devices 2122 and 2124 are open when clock signal $\phi$ is de-asserted. Each of switching devices 2122 and 2124 includes one or more transistors, for example. The configuration of clamping circuitry 2108 could be varied, such as to include additional switching devices, without departing from the scope hereof.

Switching circuitry 2106 is configured to electrically isolate gain stage inputs 2116 and 2118 from amplifier inputs $V_{i\_p}$ and $V_{i\_n}$ when clock signal $\phi$ is asserted in response to detecting a change in common-mode voltage at amplifier inputs $V_{i\_p}$ and $V_{i\_n}$. In certain embodiments, switching circuitry 2106 includes a respective switching device 2126 and 2128 electrically coupled in series with first capacitor 2112 and second capacitor 2114, as illustrated. Switching devices 2126 and 2128 are closed when clock signal $\phi$ is de-asserted, and switching devices 2126 and 2128 are open when clock signal $\phi$ is asserted. Each of switching devices 2126 and 2128 includes one or more transistors, for example.

Gain stage 2104 can have essentially any configuration as long as it generates a signal at a gain stage output 2130 in response to a difference in signals between gain stage inputs 2116 and 2118. For example, in some embodiments, gain stage 2104 is configured as an instrumentation amplifier. Although gain stage 2104 is illustrated as a single element for illustrative simplicity, gain stage 2104 may include multiple elements. The signal at gain stage output 2130 could be a voltage signal or a current signal, depending on the configuration of gain stage 2104. The signal at gain stage output 2130 is a differential signal in some embodiments of amplifier 2100.

Controller 2110 generates clock signal $\phi$, and controller 2110 is configured to assert clock signal $\phi$ in response to a change in slew rate and/or magnitude of common-mode voltage at amplifier inputs $V_{i\_p}$ and $V_{i\_n}$. In certain embodiments, controller 2110 detects a change in slew rate or magnitude of common-mode voltage at amplifier inputs $V_{i\_p}$ and $V_{i\_n}$ exceeding a predetermined first threshold value, and in response to detecting the change in common-mode voltage exceeding the first threshold value, controller 2110 asserts clock signal $\phi$. In particular embodiments, controller 2110 includes circuitry similar to that of the FIG. 14 common-mode response subsystem. In some embodiments, controller 2110 asserts clock signal $\phi$ until the change in common-mode voltage at gain stage inputs 2116 and 2118 falls below a second threshold value, where the first threshold value is optionally greater than the second threshold value to achieve hysteresis. In some other embodiments, controller 2110 asserts clock signal $\phi$ for a predetermined time duration after detecting the change in common-mode voltage.

Figure 22:
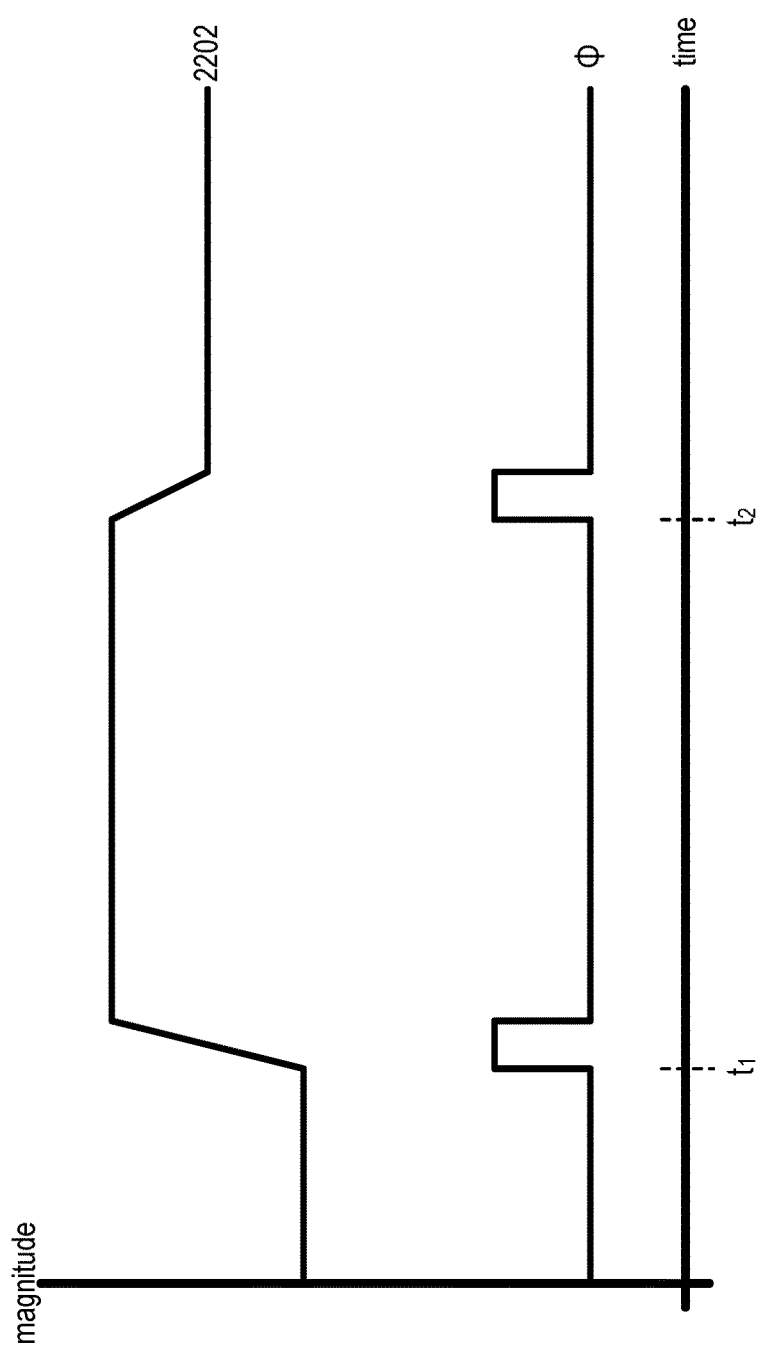
FIG. 22 is a graph illustrating a clock signal in one embodiment of the FIG. 21 amplifier.

FIG. 22 is a graph 2200 illustrating clock signal $\phi$ as generated by controller 2110 in one embodiment of amplifier 2100. The vertical axis of graph 2200 represents signal magnitude, and the horizontal axis of graph 2200 represents time. Graph 2200 includes a curve 2202 representing common-mode voltage at amplifier inputs $V_{i\_p}$ and $V_{i\_n}$ and a curve representing clock signal $\phi$. In this particular embodiment, clock signal $\phi$ is asserted when it is logic high. However, amplifier 2100 could be configured such that clock signal $\phi$ is asserted when it is logic low, without departing from the scope hereof. Magnitude of common-mode voltage at amplifier inputs $V_{i\_p}$ and $V_{i\_n}$ changes at a high slew rate at times $t_1$ and $t_2$, resulting in controller 2110 asserting clock signal $\phi$ in response thereto.

Figure 23:
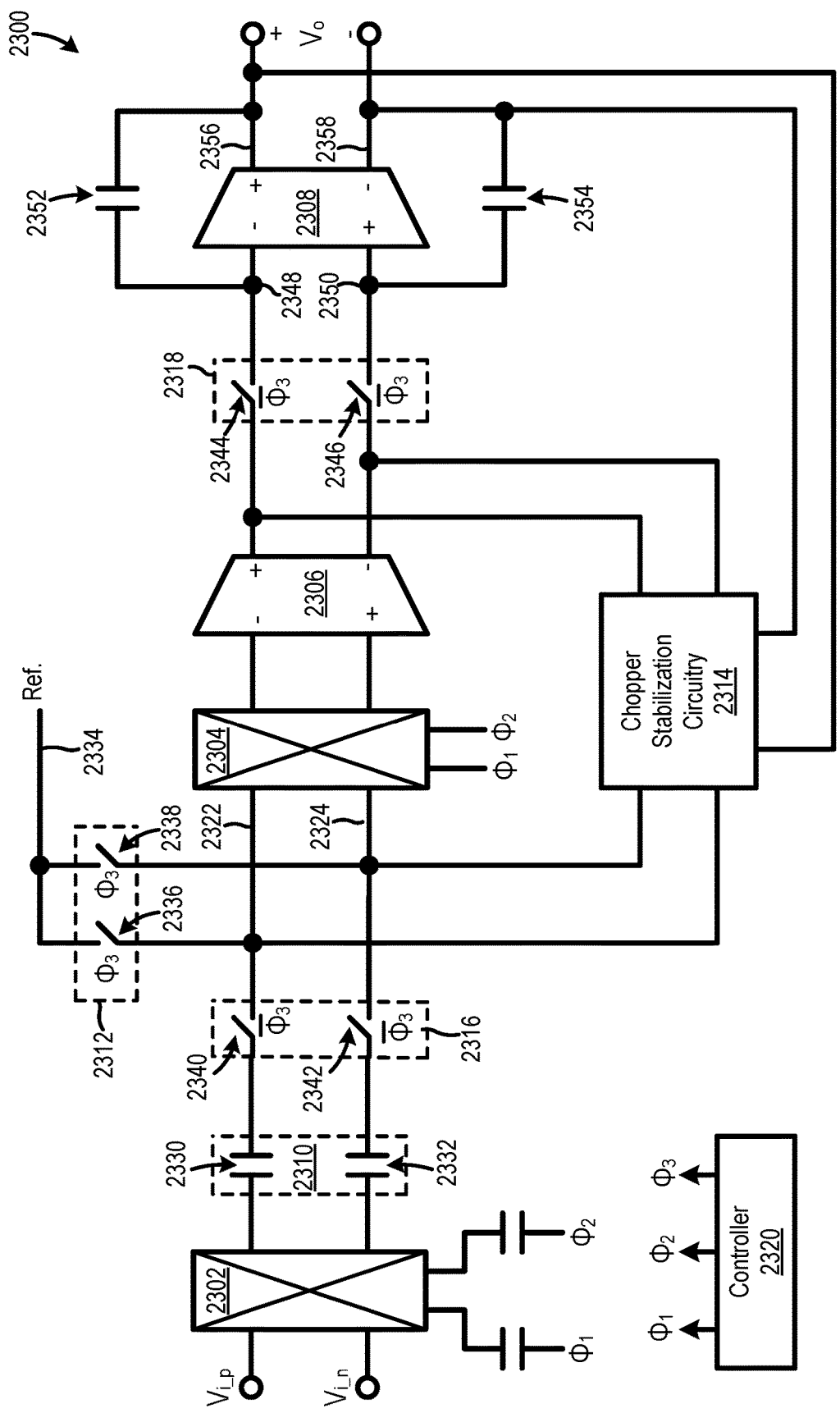
FIG. 23 illustrates a chopper-stabilized instrumentation amplifier configured to (a) clamp common-mode voltage at a capacitively-isolated portion of the instrumentation amplifier to a reference voltage and (b) isolate a gain stage from amplifier inputs, in response to a change in common-mode voltage, according to an embodiment.

FIG. 23 illustrates a chopper-stabilized instrumentation amplifier 2300 including a first chopper 2302, a second chopper 2304, a first gain stage 2306, a second gain stage 2308, a capacitive isolation stage 2310, clamping circuitry 2312, chopper stabilization circuitry 2314, first switching circuitry 2316, second switching circuitry 2318, and a controller 2320. First chopper 2302 is electrically coupled between (a) amplifier inputs $V_{i\_p}$ and $V_{i\_n}$ and (b) capacitive isolation stage 2310. First chopper 2302 is controlled by clock signals $\phi_1$ and $\phi_2$ and includes at least a first operating state and a second operating state analogous to the first and second operating states of first chopper 1302 of FIG. 13. First chopper 2302 operates in its first operating state when clock signal $\phi_1$ is asserted, and first chopper 2302 operates in its second operating state when clock signal $\phi_2$ is asserted. In some embodiments, first chopper 2302 includes a plurality of transistors (not shown) controlled by clock signals $\phi_1$ and $\phi_2$ to realize the first and second operating states.

Capacitive isolation stage 2310 is electrically coupled between first chopper 2302 and inputs 2322 and 2324 of second chopper 2304. Capacitive isolation stage 2310 electrically couples alternating current (AC) signals between first chopper 2302 and second chopper 2304 while blocking transmission of DC signals. In some embodiments, capacitive isolation stage 2310 includes a first capacitor 2330 and a second capacitor 2332, as illustrated. In these embodiments, first capacitor 2330 is electrically coupled in series with second chopper input 2322, and second capacitor 2332 is electrically coupled in series with second chopper input 2324. Capacitive isolation stage 2310 could include additional capacitors without departing from the scope hereof. Additionally, capacitive isolation stage 2310 could be replaced with another device transmitting only AC signals, such as an optocoupler.

Clamping circuitry 2312 is electrically coupled between second chopper inputs 2322 and 2324 and a reference voltage rail 2334. In certain embodiments, reference voltage rail 2334 has a fixed electrical potential that is set to achieve a desired common-mode voltage at second chopper inputs 2322 and 2324. Clamping circuit 2312 is configured to clamp second chopper inputs 2322 and 2324 to reference voltage rail 2334 when clock signal $\phi_3$ is asserted, thereby clamping common-mode voltage at second chopper inputs 2322 and 2324 to a reference voltage of reference voltage rail 2334. Clamping circuitry 2312 repeatedly clamps second chopper inputs 2322 and 2324 to reference voltage rail 2334 in response to a change in common-mode voltage at amplifier inputs $V_{i\_p}$ and $V_{i\_n}$, thereby repeatedly resetting common-mode voltage in instrumentation amplifier 2300, to help minimize common-mode voltage settling time after a transient event. In certain embodiments, clamping circuitry 2312 includes switching devices 2336 and 2338 electrically coupled between reference voltage rail 2334 and second chopper inputs 2322 and 2324, respectively, as illustrated. Switching devices 2336 and 2338 are closed when clock signal $\phi_3$ is asserted, to respectively clamp second chopper inputs 2322 and 2324 to reference voltage rail 2334. Switching devices 2336 and 2338 are open when clock signal $\phi_3$ is de-asserted. Each of switching devices 2336 and 2338 includes one or more transistors, for example. The configuration of clamping circuitry 2312 could be varied, such as to include additional switching devices, without departing from the scope hereof.

First switching circuitry 2316 is configured to electrically isolate second chopper inputs 2322 and 2324 from amplifier inputs $V_{i\_p}$ and $V_{i\_n}$ when clock signal $\phi_3$ is asserted, i.e., in response to a detected change in common-mode voltage at amplifier inputs $V_{i\_p}$ and $V_{i\_n}$. In certain embodiments, first switching circuitry 2316 includes a respective switching device 2340 and 2342 electrically coupled in series with second chopper inputs 2322 and 2324, as illustrated. Switching devices 2340 and 2342 are closed when clock signal $\phi_3$ is de-asserted, and switching devices 2340 and 2342 are open when clock signal $\phi_3$ is asserted. Each of switching devices 2340 and 2342 includes one or more transistors, for example. Although first switching circuitry 2316 is illustrated as being electrically coupled between capacitive isolation stage 2310 and second chopper 2304, first switching circuitry 2316 could alternately be electrically coupled between first chopper 2302 and capacitive isolation stage 2310.

Second chopper 2304 is electrically coupled between capacitive isolation stage 2310 and first gain stage 2306. Second chopper 2304 is controlled by clock signals $\phi_1$ and $\phi_2$ in a manner like that of first chopper 2302. In particular, second chopper 2304 operates in its first operating state when clock signal $\phi_1$ is asserted, and second chopper 2304 operates in its second operating state when clock signal $\phi_2$ is asserted. In some embodiments, second chopper 2304 includes a plurality of transistors (not shown) controlled by clock signals $\phi_1$ and $\phi_2$ to realize the first and second operating states.

First gain stage 2306 is communicatively coupled to capacitive isolation stage 2310 via second chopper 2304. In particular embodiments, first gain stage 2306 performs a transconductance function, i.e., it generates differential output current signals in response to a difference in input voltage signals. However, the configuration of first gain stage 2306 could vary without departing from the scope hereof. Although first gain stage 2306 is illustrated as a single element for illustrative simplicity, first gain stage 2306 may include a plurality of elements.

Second switching circuitry 2318 is configured to electrically isolate second gain stage 2308 from first gain stage 2306 when clock signal $\phi_3$ is asserted. In certain embodiments, second switching circuitry 2318 includes a respective switching device 2344 and 2346 electrically coupled in series with inputs 2348 and 2350 of second gain stage 2308, as illustrated. Switching devices 2344 and 2346 are closed when clock signal $\phi_3$ is de-asserted, and switching devices 2344 and 2346 are open when clock signal $\phi_3$ is asserted. Each of switching devices 2344 and 2346 includes one or more transistors, for example.

In particular embodiments, second gain stage 2308 performs a transconductance function, and instrumentation amplifier 2300 further includes feedback capacitors 2352 and 2354, as illustrated. Feedback capacitor 2352 is electrically coupled between second gain stage input 2348 and an output 2356 of second gain stage 2308. Feedback capacitor 2354 is electrically coupled between second gain stage input 2350 and an output 2358 of second gain stage 2308. Accordingly, second gain stage 2308 is miller-compensated. The configuration of second gain stage 2308 could vary, though, without departing from the scope hereof. Although second gain stage 2308 is illustrated as a single element for illustrative simplicity, second gain stage 2308 may include a plurality of elements without departing from the scope hereof.

Figure 24:
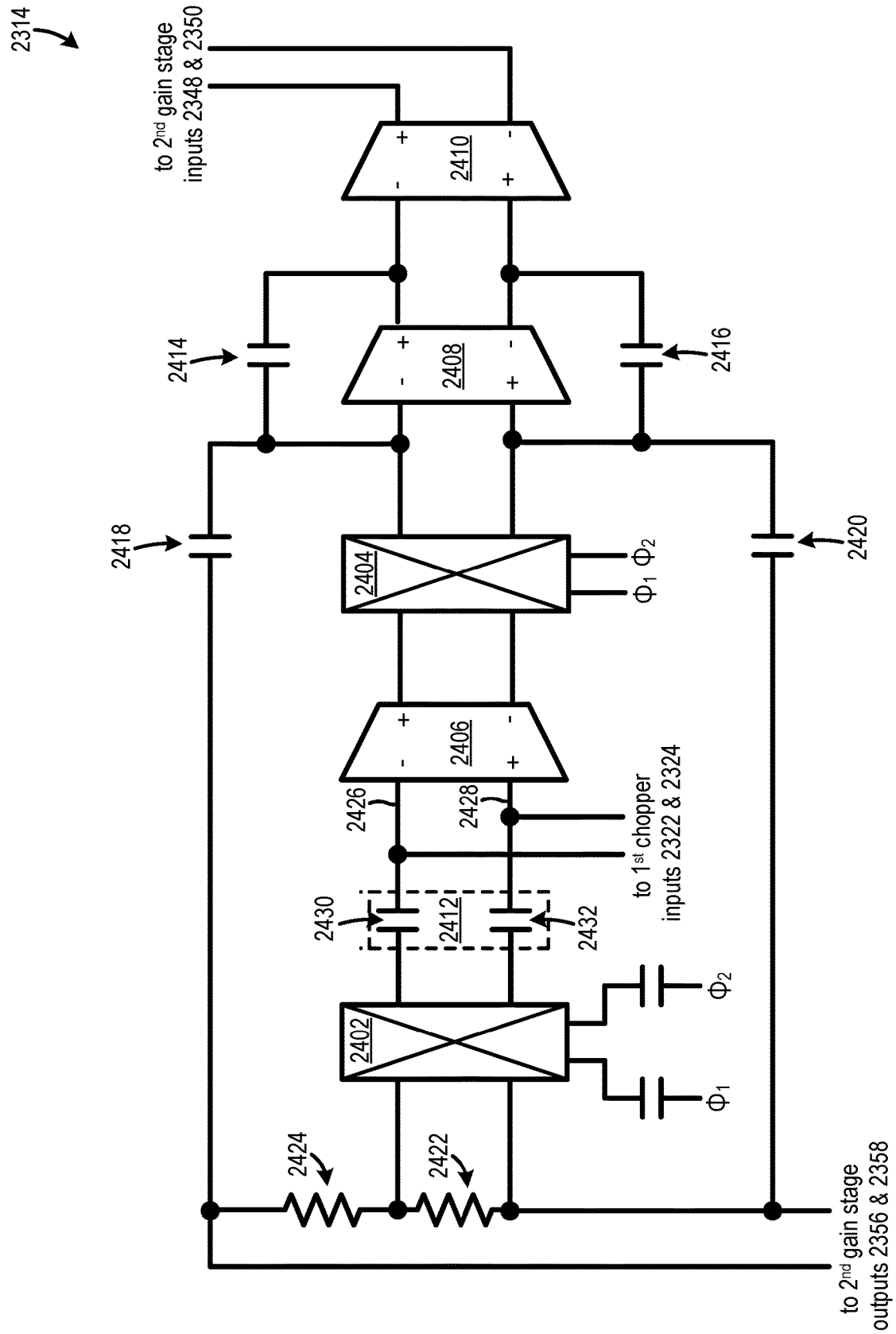
FIG. 24 illustrates chopper stabilization circuitry of the FIG. 23 instrumentation amplifier.

FIG. 24 illustrates chopper stabilization circuitry 2314 including a third chopper 2402, a fourth chopper 2404, a third gain stage 2406, a fourth gain stage 2408, a fifth gain stage 2410, feedback capacitors 2414 and 2416, feedback capacitors 2418 and 2420, and resistors 2422 and 2424. Resistors 2422 and 2424 collectively form a voltage divider across outputs of second gain stage 2308, and third chopper 2402 is electrically coupled between resistor 2422 and second capacitive isolation stage 2412. Third chopper 2402 is controlled by clock signals $\phi_1$ and $\phi_2$ in a manner like that of first chopper 2302. In particular, third chopper 2402 operates in its first operating state when clock signal $\phi_1$ is asserted, and third chopper 2402 operates in its second operating state when clock signal $\phi_2$ is asserted. In some embodiments, third chopper 2402 includes a plurality of transistors (not shown) controlled by clock signals $\phi_1$ and $\phi_2$ to realize the first and second operating states.

Second capacitive isolation stage 2412 is electrically coupled between third chopper 2402 and inputs 2426 and 2428 of third gain stage 2406. Capacitive isolation stage 2412 electrically couples alternating current (AC) signals between third chopper 2402 and third gain stage 2406 while blocking transmission of DC signals. In some embodiments, capacitive isolation stage 2412 includes a third capacitor 2430 and a fourth capacitor 2432, as illustrated. In these embodiments, third capacitor 2430 is electrically coupled in series with third gain stage input 2426, and fourth capacitor 2432 is electrically coupled in series with third gain stage input 2428. Capacitive isolation stage 2412 could include additional capacitors without departing from the scope hereof. Additionally, capacitive isolation stage 2412 could be replaced with another device transmitting only AC signals, such as an optocoupler.

Third gain stage 2406 is communicatively coupled between second capacitive isolation stage 2412 and fourth chopper 2404. In particular embodiments, third gain stage 2406 performs a transconductance function, i.e., it generates differential output current signals in response to a difference in input voltage signals. However, the configuration of third gain stage 2406 could vary without departing from the scope hereof. Although third gain stage 2406 is illustrated as a single element for illustrative simplicity, third gain stage 2406 may include a plurality of elements.

Fourth chopper 2404 is electrically coupled between third gain stage 2406 and fourth gain stage 2408. Fourth chopper 2404 is controlled by clock signals $\phi_1$ and $\phi_2$ in a manner like that of first chopper 2302. In particular, fourth chopper 2404 operates in its first operating state when clock signal $\phi_1$ is asserted, and fourth chopper 2404 operates in its second operating state when clock signal $\phi_2$ is asserted. In some embodiments, fourth chopper 2404 includes a plurality of transistors (not shown) controlled by clock signals $\phi_1$ and $\phi_2$ to realize the first and second operating states.

Fourth gain stage 2408 is electrically coupled between fourth chopper 2404 and fifth gain stage 2410. In particular embodiments, fourth gain stage 2408 performs a transconductance function. Feedback capacitors 2414 and 2416 are electrically coupled between respective inputs and outputs of fourth gain stage 2408. The configuration of fourth gain stage 2408 could vary without departing from the scope hereof. Although fourth gain stage 2408 is illustrated as a single element for illustrative simplicity, fourth gain stage 2408 may include a plurality of elements without departing from the scope hereof. Feedback capacitors 2418 and 2420 are electrically coupled between respective outputs of second gain stage 2308 and respective inputs of fourth gain stage 2408.

Fifth gain stage 2410 is electrically coupled between fourth gain stage 2408 and second gain stage inputs 2348 and 2350. In particular embodiments, fifth gain stage 2410 performs a transconductance function, but the configuration of fifth gain stage 2410 could vary without departing from the scope hereof. Although fifth gain stage 2410 is illustrated as a single element for illustrative simplicity, fifth gain stage 2410 may include a plurality of elements without departing from the scope hereof.

Controller 2320 (FIG. 23) generates first clock signal $\phi_1$, second clock signal $\phi_2$, and third clock signal $\phi_3$. Controller 2320 is formed, for example, of analog electrical circuitry, digital electrical circuitry, or a combination of analog and digital electrical circuitry. Although controller 2320 is symbolically illustrated as a single element, controller 2320 could be formed of multiple elements, such as multiple integrated circuits and/or multiple discrete components.

In certain embodiments, controller 2320 generates first clock signal $\phi_1$ and second clock signal $\phi_2$ such that first clock signal $\phi_1$ and second clock signal $\phi_2$ are asserted in a complementary manner, i.e., first clock signal $\phi_1$ is asserted when second clock signal $\phi_2$ is de-asserted, and vice versa. Consequently, first, second, third, and fourth choppers 2302, 2304, 2402, and 2404 repeatedly switch between their respective first and second operating states in unison, in these embodiments. First gain stage 2306 forms part of a high-frequency, low-gain first path, and third gain stage 2406 forms part of a low-offset, low-frequency, and low-gain second path. Chopper stabilization circuitry 2314 corrects input offset voltage of first gain stage 2306 to the extent that the second path has a higher gain than the first path.

Controller 2320 asserts third clock signal $\phi_3$ at least in response to a change in slew rate and/or magnitude of common-mode voltage at amplifier inputs $V_{i\_p}$ and $V_{i\_n}$. In certain embodiments, controller 2320 detects a change in slew rate or magnitude of common-mode voltage at amplifier inputs $V_{i\_p}$ and $V_{i\_n}$ exceeding a predetermined first threshold value, and in response to detecting the change in common-mode voltage exceeding the first threshold value, controller 2320 asserts clock signal $\phi_3$. In particular embodiments, controller 2320 includes circuitry similar to that of the FIG. 14 common-mode response subsystem.

Combinations of Features

Features described above may be combined in various ways without departing from the scope hereof. The following examples illustrate some possible combinations:

(A1) A capacitive-coupled chopper instrumentation amplifier (CCIA) may include (1) a first chopper, (2) a first gain stage, (3) a capacitive isolation stage electrically coupled between inputs of the first gain stage and the first chopper, (4) a second gain stage, (5) a second chopper electrically coupled between outputs of the first gain stage and inputs of the second gain stage, and (6) clamping circuitry electrically coupled between the inputs of the first gain stage and a reference voltage rail.

(A2) In the CCIA denoted as (A1), the clamping circuitry may include a plurality of switching devices configured to electrically clamp the inputs of the first gain stage to the reference voltage rail.

(A3) Any one of the CCIAs denoted as (A1) and (A2) may further include first switching circuitry configured to electrically isolate the inputs of the first gain stage from inputs of the CCIA when the clamping circuitry clamps the inputs of the first gain stage to the reference voltage rail.

(A4) Any of the CCIAs denoted as (A1) through (A3) may further include second switching circuitry configured to electrically isolate the inputs of the second gain stage from the outputs of the first gain stage when the clamping circuitry clamps the inputs of the first gain stage to the reference voltage rail.

(A5) Any of the CCIAs denoted as (A1) through (A4) may further include auto-zeroing circuitry electrically coupled to the outputs of the first gain stage.

(A6) In the CCIA denoted as (A5), the auto-zeroing circuitry may be configured to inject current at the outputs of the first gain stage to compensate for output ripple induced by the first and second choppers.

(A7) In any one of the CCIAs denoted as (A5) through (A6), the auto-zeroing circuitry may include (1) a third gain stage including outputs electrically coupled to the outputs of the first gain stage, (2) first and second auto-zeroing capacitors electrically coupled to inputs of the third gain stage, and (3) respective first and second auto-zeroing switching devices electrically coupled between the first and second auto-zeroing capacitors and the outputs of the first gain stage, respectively.

(A8) In any one of the CCIAs denoted as (A5) through (A7), the auto-zeroing circuitry may be configured to sample the outputs of the first gain stage when the clamping circuitry clamps the inputs of the first gain stage to the reference voltage rail.

(A9) Any one of the CCIAs denoted as (A1) through (A8) may further include a controller configured to (1) cause each of the first and second choppers to repeatedly switch between a first operating state and a second operating state, (2) cause the clamping circuitry to clamp the inputs of the first gain stage to the reference voltage rail at least once during each time that the first and second choppers operate in their respective first operating states, and (3) cause the clamping circuitry to clamp the inputs of the first gain stage to the reference voltage rail at least once during each time that the first and second choppers operate in their respective second operating states.

(A10) In the CCIA denoted as (A9), the controller may be further configured to (1) cause the clamping circuitry to clamp the inputs of the first gain stage to the reference voltage rail at least twice during each time that the first and second choppers operate in their respective first operating states, and (2) cause the clamping circuitry to clamp the inputs of the first gain stage to the reference voltage rail at least twice during each time that the first and second choppers operate in their respective second operating states.

(A11) In the CCIA denoted as (A10), the controller may be further configured to (1) cause the clamping circuitry to clamp the inputs of the first gain stage to the reference voltage rail at least three times during each time that the first and second choppers operate in their respective first operating states and (2) cause the clamping circuitry to clamp the inputs of the first gain stage to the reference voltage rail at least three times during each time that the first and second choppers operate in their respective second operating states.

(A12) In any one of the CCIAs denoted as (A1) through (A11), the reference voltage rail may have a fixed electrical potential.

(B1) A method for reducing common-mode settling time of a capacitive-coupled chopper instrumentation amplifier (CCIA) may include (1) clamping inputs of a first gain stage of the CCIA to a reference voltage rail at least once during each time that first and second choppers of the CCIA operate in respective first operating states and (2) clamping the inputs of the first gain stage of the CCIA to the reference voltage rail at least once during each time that the first and second choppers of the CCIA operate in respective second operating states.

(B2) The method denoted as (B1) may further include injecting current at outputs of the first gain stage to compensate for ripple induced by the first and second choppers.

(B3) The method denoted as (B2) may further include sampling the outputs of the first gain stage when clamping the inputs of the first gain stage to the reference voltage rail, to determine magnitude of current to inject at the outputs of the first gain stage to compensate for output ripple induced by the first and second choppers.

(B4) Any one of the methods denoted as (B1) through (B3) may further include electrically isolating the inputs of the first gain stage from inputs of the CCIA, when clamping the inputs of the first gain stage to the reference voltage rail.

(B5) Any of the methods denoted as (B1) through (B4) may further include electrically isolating inputs of a second gain stage of the CCIA from the outputs of the first gain stage, when clamping the inputs of the first gain stage to the reference voltage rail.

(B6) In any one of the methods denoted as (B1) through (B5), each step of clamping may include electrically coupling the inputs of the first gain stage to the reference voltage rail using a plurality of switching devices.

(B7) Any of the methods denoted as (B1) through (B6) may further include causing each of the first and second choppers to repeatedly switch between its respective first operating state and its respective second operating state.

(B8) Any of the methods denoted as (B1) through (B7) may further include (1) clamping the inputs of the first gain stage of the CCIA to the reference voltage rail at least twice during each time that the first and second choppers of the CCIA operate in respective first operating states and (2) clamping the inputs of the first gain stage of the CCIA to the reference voltage rail at least twice during each time that the first and second choppers of the CCIA operate in respective second operating states.

(B9) Any of the methods denoted as (B1) through (B8) may further include (1) clamping the inputs of the first gain stage of the CCIA to the reference voltage rail at least three times during each time that the first and second choppers of the CCIA operate in respective first operating states and (2) clamping the inputs of the first gain stage of the CCIA to the reference voltage rail at least three times during each time that the first and second choppers of the CCIA operate in respective second operating states.

(B10) In any of the methods denoted as (B1) through (B9), the reference voltage rail may have a fixed electrical potential.

(C1) A capacitive-coupled amplifier may include (1) a capacitive isolation stage, (2) at least one gain stage communicatively coupled to the capacitive isolation stage, and (3) clamping circuitry configured to repeatedly clamp common-mode voltage at a capacitively-isolated portion of the amplifier to a reference voltage.

(C2) In the amplifier denoted as (C1), the at least one gain stage may include a first gain stage, and the clamping circuitry may be electrically coupled between inputs of the first gain stage and a reference voltage rail.

(C3) In the amplifier denoted as (C2), the clamping circuitry may include a plurality of switching devices configured to electrically clamp the inputs of the first gain stage to the reference voltage rail.

(C4) The amplifier denoted as (C1) may further include a chopper, where the clamping circuitry is electrically coupled between inputs of the chopper and the reference voltage rail.

(C5) Any one of the amplifiers denoted as (C1) through (C4) may further include switching circuitry configured to electrically isolate the at least one gain stage from inputs of the amplifier when the clamping circuitry clamps the common-mode voltage to the reference voltage rail.

(C6) Any of the amplifiers denoted as (C1) through (C5) may further include a controller configured to cause the clamping circuitry to repeatedly clamp the common-mode voltage to the reference voltage.

(D1) A capacitive-coupled chopper instrumentation amplifier (CCIA), may include (1) a first chopper, (2) a first gain stage, (3) a capacitive isolation stage electrically coupled between inputs of the first gain stage and the first chopper, (4) a second gain stage, (5) a second chopper electrically coupled between outputs of the first gain stage and inputs of the second gain stage, (6) clamping circuitry electrically coupled between the inputs of the first gain stage and a reference voltage rail, and (7) a controller configured to (i) detect a change in a first common-mode voltage exceeding a threshold value, the first common-mode voltage being a common-mode voltage at inputs of the CCIA, and (ii) in response to detecting the change in the first common-mode voltage exceeding the threshold value, cause the clamping circuitry to clamp the inputs of the first gain stage to the reference voltage rail.

(D2) The CCIA denoted as (D1) may further include first switching circuitry configured to electrically isolate the inputs of the first gain stage from the inputs of the CCIA when the clamping circuitry clamps the inputs of the first gain stage to the reference voltage rail.

(D3) In any one of the CCIAs denoted as (D1) and (D2), the controller may be further configured to cause the clamping circuitry to clamp the inputs of the first gain stage to the reference voltage rail in response to detecting a change in slew rate of the first common-mode voltage exceeding the threshold value.

(D4) Any one of the CCIAs denoted as (D1) through (D3) may further include auto-zeroing circuitry electrically coupled to the outputs of the first gain stage.

(D5) In the CCIA denoted as (D4), the auto-zeroing circuitry may be configured to inject current at the outputs of the first gain stage to compensate for ripple induced by the first and second choppers.

(D6) In any one of the CCIAs denoted as (D4) and (D5), the auto-zeroing circuit may include (1) a third gain stage including outputs electrically coupled to the outputs of the first gain stage, (2) first and second auto-zeroing capacitors electrically coupled to inputs of the third gain stage, and (3) respective first and second auto-zeroing switching devices electrically coupled between the first and second auto-zeroing capacitors and the outputs of the first gain stage.

(D7) In any one of the CCIAs denoted as (D4) through (D6), the controller may be further configured to cause the auto-zero circuitry to sample the outputs of the first gain stage when the clamping circuitry clamps the inputs of the first gain stage to the reference voltage rail.

(D8) In any one of the CCIAs denoted as (D1) through (D7), the clamping circuitry may include a plurality of switching devices configured to electrically clamp the inputs of the first gain stage to the reference voltage rail.

(D9) Any one of the CCIAs denoted as (D1) through (D8) may further include second switching circuitry configured to electrically isolate the inputs of the second gain stage from the outputs of the first gain stage when the clamping circuitry clamps the inputs of the first gain stage to the reference voltage rail.

(D10) Any one of the CCIAs denoted as (D1) through (D9) may further include a controller configured to cause each of the first and second choppers to repeatedly switch between a respective first operating state and a respective second operating state.

(D11) In any one of the CCIAs denoted as (D1) through (D10), the reference voltage rail may be at a fixed electrical potential.

(E1) A method for reducing common-mode settling of a capacitive-coupled chopper instrumentation amplifier (CCIA) may include (1) detecting a change in a first common-mode voltage exceeding a threshold value, the first common-mode voltage being a common-mode voltage at inputs of the CCIA and (2) in response to detecting the change in the first common-mode voltage exceeding the threshold value, electrically isolating inputs of a first gain stage of the CCIA from inputs of the CCIA.

(E2) The method denoted as (E1) may further include, in response to detecting the change in the first common-mode voltage exceeding the threshold value, clamping the inputs of the first gain stage to a reference voltage rail.

(E3) In any one of the methods denoted as (E1) and (E2), the step of detecting the change in the first common-mode voltage exceeding the threshold value may include detecting a change in slew rate of the first common-mode voltage exceeding the threshold value.

(E4) Any of the methods denoted as (E1) through (E3) may further include injecting current at outputs of the first gain stage to compensate for ripple induced by first and second choppers of the CCIA.

(E5) The method denoted as (E4) may further include sampling the outputs of the first gain stage when clamping the inputs of the first gain stage to the reference voltage rail, to determine magnitude of current to inject at the outputs of the first gain stage to compensate for ripple induced by the first and second choppers of the CCIA.

(E6) Any one of the methods denoted as (E1) through (E5) may further include electrically isolating inputs of a second gain stage of the CCIA from the outputs of the first gain stage, when clamping the inputs of the first gain stage to the reference voltage rail.

(E7) In any of the methods denoted as (E1) through (E6), each step of clamping may include electrically coupling the inputs of the first gain stage to the reference voltage rail using a plurality of switching devices.

(E8) The method denoted as (E1) may further include causing each of first and second choppers of the CCIA to repeatedly switch between a respective first operating state and a respective second operating state.

(E9) In any of the methods denoted as (E1) through (E8), the reference voltage rail may be at a fixed electrical potential.

(F1) A capacitive-coupled amplifier may include (1) a capacitive isolation stage, (2) a gain stage communicatively coupled to the capacitive isolation stage, (3) switching circuitry configured to electrically isolate the gain stage from inputs of the amplifier, and (4) a controller configured to (i) detect a change in a first common-mode voltage exceeding a threshold value, the first common-mode voltage being a common-mode voltage at the inputs of the amplifier, and (ii) in response to detecting the change in the first common-mode voltage exceeding the threshold value, cause the switching circuitry to electrically isolate the gain stage from the inputs of the amplifier.

(F2) The amplifier denoted as (F1) may further include clamping circuitry electrically coupled between inputs of the gain stage and a reference voltage rail, where the controller is further configured to cause the clamping circuitry to clamp the inputs of the gain stage to the reference voltage rail in response to detecting the change in the first common-mode voltage exceeding the threshold value.

(F3) In the amplifier denoted as (F2), the clamping circuitry may include a plurality of switching devices configured to electrically clamp the inputs of the gain stage to the reference voltage rail.

(F4) The amplifier denoted as (F1) may further include (1) a chopper and (2) clamping circuitry electrically coupled between inputs of the chopper and a reference voltage rail, where the controller is further configured to cause the clamping circuitry to clamp the inputs of the chopper to the reference voltage rail in response to detecting the change in the first common-mode voltage exceeding the threshold value.

(F5) In any one of the amplifiers denoted as (F2) through (F4), the reference voltage rail may have a fixed electrical potential.

(F6) In any one of the amplifiers denoted as (F1) through (F5), the controller may be further configured to cause the switching circuitry to electrically isolate the gain stage from the inputs of the amplifier in response to detecting change in slew rate of the first common-mode voltage exceeding the threshold value.

Changes may be made in the above amplifiers and methods without departing from the scope hereof. For example, auto-zeroing circuitry 314 could be replaced with alternative auto-zeroing circuitry that works in conjunction with clamping circuitry 312. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A capacitive-coupled amplifier, comprising:
  a capacitive isolation stage at inputs of a capacitive coupled amplifier;
  a gain stage communicatively coupled to the capacitive isolation stage;
  first switching circuitry configured to electrically isolate the gain stage from the capacitive isolation stage;

a controller configured to assert a control signal to cause the first switching circuitry to electrically isolate the gain stage from the capacitive isolation stage;

second switching circuitry electrically coupled to the gain stage between the gain stage and the first switching circuitry configured to clamp inputs of the gain stage to a voltage reference when the controller asserts the control signal to electrically isolate the gain stage from the capacitive isolation stage.

2. The capacitive coupled amplifier of claim 1, wherein the capacitive-coupled amplifier is a differential amplifier.

3. The capacitive coupled amplifier of claim 1, wherein the controller is further configured to assert the control signal in response to sensing a common mode voltage exceeding first threshold.

4. The capacitive coupled amplifier of claim 3, wherein the controller is further configured to de-assert the control signal in response to sensing the common mode voltage falling below a second threshold.

5. The capacitive coupled amplifier of claim 1, wherein the controller is further configured to sense a slew rate of common mode voltage exceeding a threshold.

6. A method for reducing common-mode settling time of a capacitive-coupled amplifier comprising:

detecting a change in a common mode voltage, the common mode voltage exceeding a threshold value;

electrically isolating gain stage inputs from amplifier inputs in response to the common mode voltage exceeding the threshold value; and clamping the gain stage inputs to a voltage reference.

7. The method of claim 6 further comprising:

injecting current at an output of the capacitive-coupled amplifier based on an output ripple.

8. A method for reducing common-mode settling time of a capacitive-coupled amplifier comprising:

detecting a change in a slew rate of a common mode voltage, the slew rate exceeding a threshold value;

electrically isolating gain stage inputs from amplifier inputs in response to the slew rate exceeding the threshold value; and clamping the gain stage inputs to a voltage reference in response to the slew rate exceeding the threshold value.

9. The method of claim 8 further comprising;

injecting current at an output of the capacitive-coupled amplifier based on an output ripple.

* * * * *